(12) United States Patent  
Ono et al.

(10) Patent No.: US 9,000,595 B2  
(45) Date of Patent: Apr. 7, 2015

(54) METHOD OF MANUFACTURING SEMICONDUCTOR DEVICE AND SEMICONDUCTOR DEVICE

(71) Applicant: Renesas Electronics Corporation, Kawasaki-shi, Kanagawa (JP)

(72) Inventors: Eiji Ono, Yanai (JP); Eiji Osugi, Yanai (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 14/244,072

(22) Filed: Apr. 3, 2014

(65) Prior Publication Data

US 2014/0210091 A1 Jul. 31, 2014

Related U.S. Application Data

(63) Continuation of application No. 13/767,512, filed on Feb. 14, 2013, now Pat. No. 8,710,663.

(30) Foreign Application Priority Data

Mar. 2, 2012 (JP) ................................ 2012-046330

(51) Int. Cl.

| H01L 23/48 | (2006.01) |
|---|---|
| H01L 23/498 | (2006.01) |
| H01L 21/50 | (2006.01) |
| H01L 21/304 | (2006.01) |
| H01L 23/00 | (2006.01) |
| H01L 23/488 | (2006.01) |
| H01L 23/31 | (2006.01) |
| H01L 21/56 | (2006.01) |

(52) U.S. Cl.  
CPC .......... *H01L 23/49866* (2013.01); *H01L 21/50* (2013.01); *H01L 21/304* (2013.01); *H01L 24/32* (2013.01); *H01L 24/97* (2013.01); *H01L 23/488* (2013.01); *H01L 2224/32245* (2013.01); *H01L 2224/48091* (2013.01); *H01L 2224/48247* (2013.01); *H01L 2224/49171* (2013.01); *H01L 2224/73265* (2013.01); *H01L 2224/83385* (2013.01); *H01L 2224/45144* (2013.01); *H01L 23/3107* (2013.01); *H01L 21/568* (2013.01); *H01L 2224/97* (2013.01)

(58) Field of Classification Search  
None  
See application file for complete search history.

(56) References Cited

U.S. PATENT DOCUMENTS

| 6,166,430 A * | 12/2000 | Yamaguchi ................... 257/666 |
|---|---|---|
| 7,789,287 B2 | 9/2010 | Ogashiwa et al. |
| 2002/0180011 A1 | 12/2002 | Tanaka |
| 2005/0029638 A1 * | 2/2005 | Ahn et al. ...................... 257/676 |

FOREIGN PATENT DOCUMENTS

| JP | 63-059357 U | 4/1988 |
|---|---|---|
| JP | 2004-126622 A | 4/2004 |
| JP | 2007-324523 A | 12/2007 |

* cited by examiner

*Primary Examiner* — Kyoung Lee  
(74) *Attorney, Agent, or Firm* — Miles & Stockbridge P.C.

(57) ABSTRACT

To provide a semiconductor device having a reduced size and thickness while suppressing deterioration in reliability. After a semiconductor wafer is ground at a back surface thereof with a grinding material into a predetermined thickness, the resulting semiconductor wafer is diced along a cutting region to obtain a plurality of semiconductor chips. While leaving grinding grooves on the back surface of each of the semiconductor chips, the semiconductor chip is placed on the upper surface of a die island via a conductive resin paste so as to face the back surface of the semiconductor chip and the upper surface of the die island each other. The die island has, on the upper surface thereof, a concave having a depth of from 3 μm to 10 μm from the edge of the concave to the bottom of the concave.

8 Claims, 28 Drawing Sheets

METHOD OF MANUFACTURING SEMICONDUCTOR DEVICE AND SEMICONDUCTOR DEVICE

CROSS-REFERENCE TO RELATED APPLICATIONS

The disclosure of Japanese Patent Application No. 2012-046330 filed on Mar. 2, 2012 including the specification, drawings, and abstract is incorporated herein by reference in its entirety.

BACKGROUND

The present invention relates to a method of manufacturing a semiconductor device and a semiconductor device, in particular, to a technology effective when applied to a semiconductor device having a package structure in which an external terminal electrically coupled to the back surface of a semiconductor chip and an external terminal electrically coupled to a bonding pad formed on the surface of the semiconductor chip are exposed from the lower surface of a resin molding.

For example, Japanese Patent Laid-Open No. 2007-324523 (Patent Document 1) discloses a method of sintering a metal paste composed of metal powders and an organic solvent and applied to a semiconductor chip to obtain sintered powder metal, mounting a Ni plate on the semiconductor chip, heating and applying a pressure to them to bond the semiconductor chip and the Ni plate.

Japanese Patent Laid-Open No. 2004-126622 (Patent Document 2) discloses a technology of mounting, in high density, light emitting diodes each equipped with a plurality of electrodes provided on a substrate with a space therebetween, a plurality of light emitting diodes provided on the electrodes, respectively, via a conductive adhesive, and an insulating layer provided on the substrate so as to surround the conductive adhesive with the insulating layer, wherein the insulating layer is made of a material having poor wettability to the conductive adhesive.

Japanese Utility Model Laid-Open No. 59357/1988 (Patent Document 3) discloses a light emitting diode having a rough back surface and an ohmic electrode provided on a portion of the rough surface and firmly bonded, on the back surface side, to a base via a conductive adhesive.

PATENT DOCUMENTS

[Patent Document 1] Japanese Patent Laid-Open No. 2007-324523
[Patent Document 2] Japanese Patent Laid-Open No. 2004-126622
[Patent Document 3] Japanese Utility Model Laid-Open No. 59357/1988

SUMMARY OF THE INVENTION

With a reduction in size and thickness of electronic devices, a semiconductor device (semiconductor package) mounted on electronic devices is also required to have a reduced size and reduced thickness.

The present inventors have therefore studied for realizing a reduction in size and thickness of semiconductor devices by using electroplating with a base material made of a metal as a mother substrate to form external terminals (leadframe, lead, terminal, metal plate, and conductive pattern).

Described specifically, the present inventors have studied the structure in which die islands and a plurality of electrode terminals (electrodes) serving as external terminals are formed by electroplating; a semiconductor chip is placed on the upper surface of the die island while facing the upper surface of the die island and the back surface of the semiconductor chip; and the plurality of electrode terminals and a plurality of bonding pads (electrode pads, surface electrodes) formed on the surface of the semiconductor chip are electrically coupled via a plurality of conductive members, respectively.

As a result of investigation by the present inventors, semiconductor devices having such a structure have however various technical problems which will be described below.

The upper surface of the die island and the back surface of the semiconductor chip are electrically coupled via a conductive resin paste. It has been elucidated that the deficiency or excess of the conductive resin paste causes a trouble, leading to the formation of a semiconductor device having deteriorated reliability.

The supply amount of the conductive resin paste has conventionally been controlled by regulating a discharge pressure and discharge time of the conductive resin paste. It is however difficult to supply a constant amount of the conductive resin paste only by using this method. When the amount of the conductive resin paste exceeds an appropriate supply amount, for example, the conductive resin paste runs along the side surface of a die island and inevitably protrudes from the lower surface (back surface) of a resin molding for sealing the semiconductor chip, the die island, and the like. When the amount of the conductive resin paste is below the appropriate supply amount, on the other hand, the semiconductor chip is separated from the upper surface of the die island due to the lack of wetting.

The present invention therefore provides a technology capable of avoiding the above-mentioned troubles such as protrusion of the conductive resin paste to the lower surface of the resin molding or peeling of the semiconductor chip by adjusting the spreading of the conductive resin paste to be used for coupling between the upper surface of the die island and the back surface of the semiconductor chip.

An object of the invention is to provide a technology capable of manufacturing a semiconductor device having a reduced size and thickness without deteriorating the reliability of the semiconductor device.

The above-mentioned and the other objects and novel features of the invention will be apparent from the description herein and accompanying drawings.

An embodiment of a typical invention, among inventions disclosed herein, will next be described simply.

In this embodiment, there is provided a method of manufacturing a semiconductor device including the following steps. After the second main surface of a semiconductor wafer is ground with a grinding material and the semiconductor wafer is thinned while leaving a grinding groove on the second main surface, the semiconductor wafer is diced along a cutting region while leaving the grinding groove on the second main surface of the semiconductor wafer to obtain semiconductor chips. Separately, a mother substrate having thereon a die island and a plurality of electrode terminals placed around the die island and having a plurality of chip mounting regions is provided. The die island has, on the upper surface thereof, a concave and this concave has a depth of from 3 μm to 10 μm from the edge to the bottom of the concave. While leaving the grinding groove on the back surface of the semiconductor chip, the semiconductor chip is placed on the upper surface of the die island via a conductive resin paste so that the back surface of the semiconductor chip and the upper surface of the die island face each other. Then, a plurality of bonding pads of the semiconductor chip and a plurality of electrode terminals on the mother substrate are electrically coupled via a plurality of conductive members, respectively. A resin molding is then formed to encapsulate therewith the semiconductor chip, the plurality of conductive members, a portion of the die island, a portion of each of the electrode terminals, and the upper surface of the mother substrate. The mother substrate is separated from the resin molding and the lower surface of the die island and the lower surface of the electrode terminals are exposed from the resin molding.

In this embodiment, there is also provided a resin molded semiconductor device. The semiconductor device has a die island; a semiconductor chip having a surface, a plurality of bonding pads formed on the surface, and a back surface on the side opposite to the surface, and being placed on the upper surface of the die island so that the back surface of the semiconductor chip and the upper surface of the die island face each other; a plurality of electrode terminals; a plurality of conductive members for electrically coupling the plurality of bonding pads and the upper surfaces of the plurality of electrode terminals, respectively; and a resin molding. The back surface of the semiconductor chip is coupled to the upper surface of the die island via a conductive resin paste while having a plurality of visible grinding grooves on the back surface of the semiconductor chip; the lower surface of the die island and the lower surface of the plurality of electrode terminals are exposed from the resin molding; and the upper surface of the die island has a concave having a depth of from 3 μm to 10 μm from the edge to the bottom of the die island.

Advantage available by one typical embodiment of the invention disclosed herein will next be described briefly.

An object of the invention is to provide a technology capable of providing a semiconductor device having a reduced size and reduced thickness without deteriorating the reliability of the semiconductor device.

DETAILED DESCRIPTION

Figure 1:
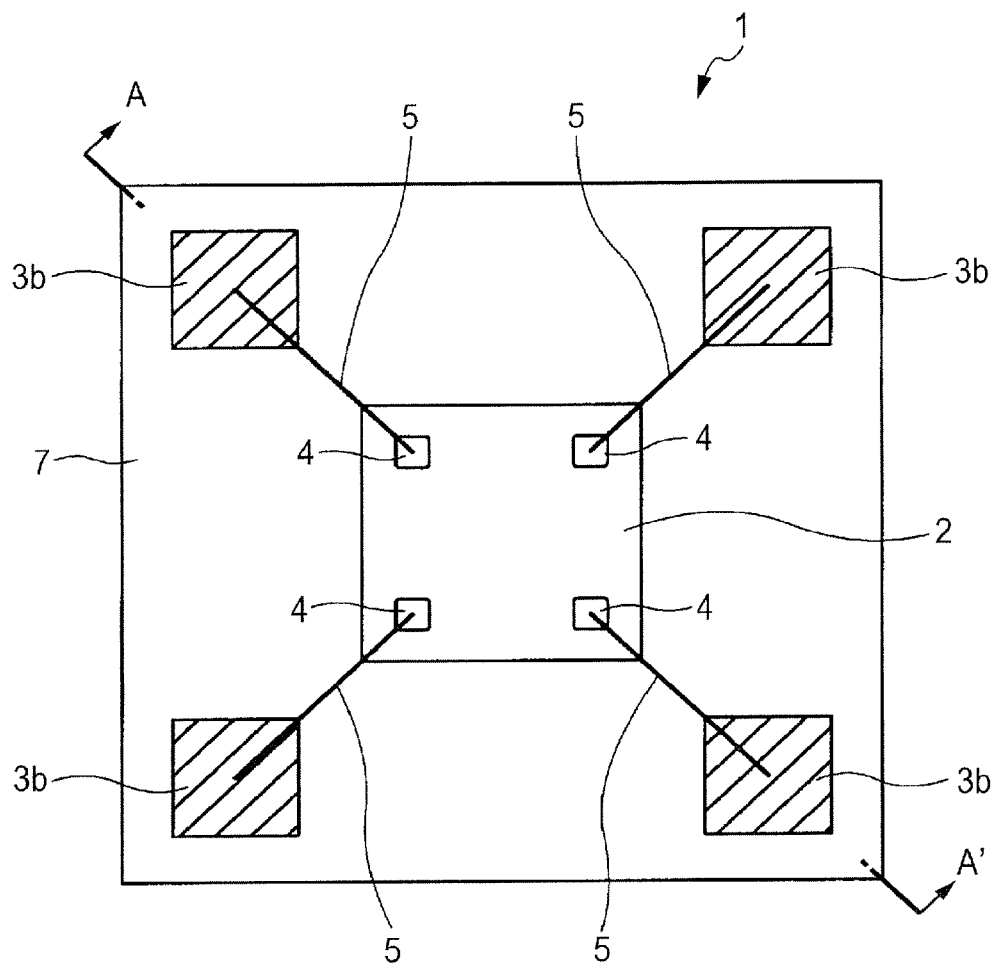
FIG. 1 is a fragmentary plan view of a semiconductor device according to First Embodiment of the invention through a resin molding on the surface side of the semiconductor.

In the following embodiment, a description will be made after divided into a plurality of sections or embodiments if necessary for convenience sake. They are not independent from each other, but in a relation such that one is a modification example, details, a complementary description, or the like of a part or whole of the other one unless otherwise specifically indicated.

And, in the below-described embodiments, when a reference is made to the number of elements (including the number, value, amount, range, or the like), the number is not limited to a specific number but may be greater than or less than the specific number, unless otherwise specifically indicated or principally apparent that the number is limited to the specific number. Further, in the below-described embodiments, it is needless to say that the constituting elements (including element steps or the like) are not always essential unless otherwise specifically indicated or principally apparent that they are essential. Similarly, in the below-described embodiments, when a reference is made to the shape, positional relationship, or the like of the constituting elements, that substantially approximate or similar to it is also embraced unless otherwise specifically indicated or principally apparent that it is not. This also applies to the above-described value and range.

In the drawings used in the below-described embodiment, some plan views may be hatched in order to facilitate viewing of them. In the below-described embodiments, the term "wafer" mainly means a Si (silicon) single crystal wafer, but the term "wafer" means not only it but also an SOI (silicon on insulator) wafer, an insulating film substrate for forming an integrated circuit thereover, or the like. The shape of the wafer is not limited to circular or substantially circular, but it may be square, rectangular or the like.

The symbol "# (mesh)" used in the following embodiment indicates the roughness of a grinding material and the numeral following it means the size of abrasive grains on the surface of the grinding material (refer to "JIS R 6001 Bonded abrasive grain sizes"). When measurement is made according to the electrical resistance testing method, for example, #360 means a grinding material having the maximum grain size of 86 μm or less and the grain size of about 35.0 μm at 50% point of cumulative height; and for example #2000 means a grinding material having the maximum grain size of 19 μm or less and the grain size of about 6.7 μm at 50% point of cumulative height.

In the following embodiment, the term "diamond wheel" is a grinding wheel having diamond abrasive grains distributed uniformly therein for grinding a workpiece (semiconductor wafer) and it embraces a two-layer structure comprised of a base not containing diamond abrasive grains and an abrasive layer containing diamond abrasive grains. The diamond wheel having a two layer structure may be either a wheel whose abrasive layer portion forms a continuous loop or a wheel whose abrasive layer portion is attached with chips at intervals (segment type).

And, in all the drawings for describing the below-described embodiment, members of a like function will be identified by like reference numerals in principle and overlapping descriptions will be omitted. Hereafter, the embodiment of the invention will be described in detail based on drawings.

(Embodiment) <Semiconductor Device>

Figure 2:
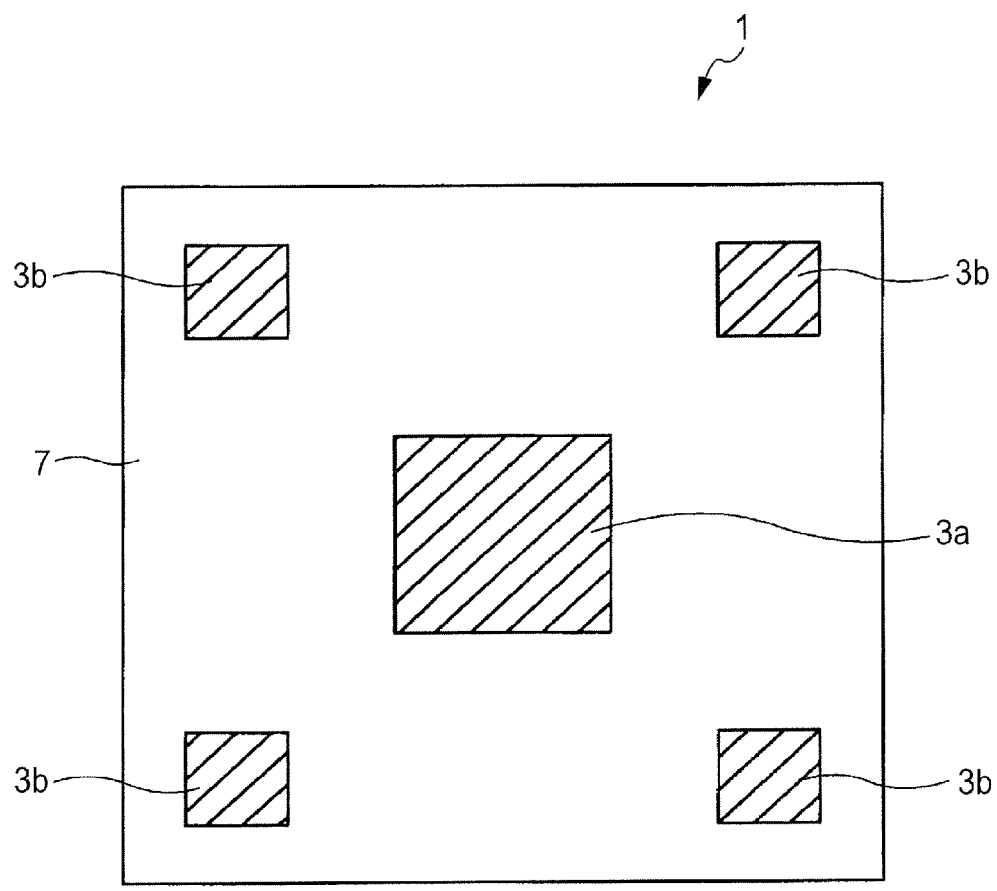
FIG. 2 is a fragmentary plan view of the back surface (mounting surface) side of the semiconductor device according to First Embodiment of the invention.
Figure 3:
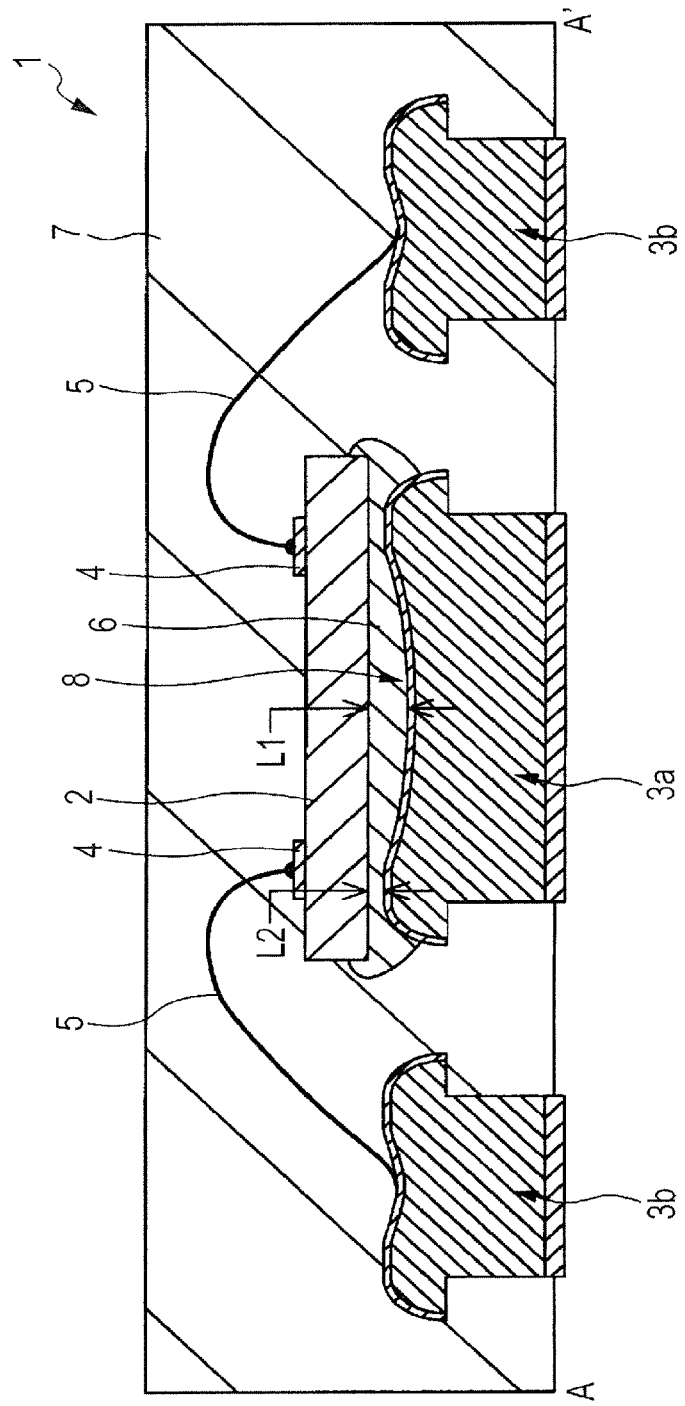
FIG. 3 is a fragmentary cross-sectional view of the semiconductor device taken along a line A-A' of FIG. 1.

The semiconductor device according to the embodiment of the invention will be described referring to FIGS. 1 to 3. FIG. 1 is a fragmentary plan view of a semiconductor device through a resin molding member on the surface side; FIG. 2 is a fragmentary plan view of the back surface (mounting surface) side of the semiconductor device; and FIG. 3 is a fragmentary cross-sectional view of the semiconductor device taken along the line A-A' of FIG. 1.

A semiconductor device (semiconductor package) 1 is comprised of a semiconductor chip 2, a die island (first electrode plate) 3a having thereon the semiconductor chip 2 and serving as an external terminal, a plurality of electrode terminals (second electrode plates, electrodes) 3b provided at the periphery of the semiconductor chip 2 and serving as an external terminal, and a plurality of conductive members 5 for electrically coupling a plurality of bonding pads (electrode pads, surface electrodes) 4 provided on the surface of the semiconductor chip 2 and the plurality of electrode terminals 3b. In the present embodiment, a semiconductor device having 5 pins of external terminals (1 pin of the die island 3a and 4 pins of the electrode terminals 3b) is shown as an example.

The semiconductor chip 2 has a surface and a back surface which is on the side opposite to that of the surface. The semiconductor chip 2 has, on the surface side thereof, for example, an integrated circuit comprised of a plurality of semiconductor elements, a multilayer wiring layer obtained by stacking a plurality of insulating layers and a plurality of wiring layers, and a surface protecting film formed so as to cover the multilayer wiring layer.

The plurality of bonding pads 4 provided on the surface of the semiconductor chip 2 is comprised of wirings (for example, aluminum (Al)) of the uppermost layer, among multilayer wirings (not illustrated) formed on the integrated circuit and they are exposed from an opening portion (not illustrated) formed in a surface protecting film (not illustrated) for protecting the integrated circuit.

The back surface of the semiconductor chip 2 and the upper surface (surface) of the die island 3a face each other and the semiconductor chip 2 is placed on the upper surface of the die island 3a via a conductive resin paste 6. The conductive resin paste 6 is made of, for example, silver (Ag). The semiconductor chip 2 has on the back surface thereof a number of grinding grooves, some of which can be visually recognized.

The die island 3a and the plurality of electrode terminals 3b each have an upper surface (a surface) and a lower surface (back surface, mounting surface) on the side opposite to the upper surface. The die island 3a and the plurality of electrode terminals 3b are films (aggregate of metal particles) formed (deposited) by plating. More specifically, a nickel (Ni) film is deposited on a gold (Au) film and a silver (Ag) film is deposited on this nickel (Ni) film. The gold (Au) film has a thickness of, for example, 0.1 μm, the nickel (Ni) film has a thickness of, for example, 60 μm, and the silver (Ag) film has a thickness of, for example, 3 Instead of the silver (Ag) film, a gold (Au) film may be formed on the nickel (Ni) film. The vertical (first direction) and horizontal (second direction orthogonal to the first direction) sizes of the die island 3 when viewed from the top are smaller than those of the semiconductor chip 2 when viewed from the top and the semiconductor chip 2 covers the entire upper surface of the die island 3a.

Moreover, portions (upper surface and side surface) of the semiconductor chip 2, a portion (side surface) of the die island 3a, portions (upper surface and side surface) of each of the plurality of electrode terminals 3b, and the plurality of conductive members 5 are sealed with a resin molding (molding) 7. From the lower surface (back surface) of the resin molding 7, however, the other portion (lower surface) of the die island 3a and the plurality of electrode terminals 3b are exposed.

As described above, the back surface of the semiconductor chip 2 and the upper surface of the die island 3a face each other and the semiconductor chip 2 is placed on the upper surface of the die island 3a via the conductive resin paste 6. The die island 3a has an upper surface not flat but having a concave (recess) 8 at the center portion thereof. The concave 8 is a region (reservoir region) where the conductive resin paste 6 gathers. The depth of the concave 8 from its edge to the bottom (a difference between a distance (corresponding to L1 in FIG. 3) from the back surface of the semiconductor chip 2 to the upper surface of the die island 3a farthest from the back surface of the semiconductor chip 2 and a distance (corresponding to L2 in FIG. 3) from the back surface of the semiconductor chip 2 to the upper surface of the die island 3a closest from the back surface of the semiconductor chip 2) is, for example, from 3 μm to 10 μm. By providing this concave 8 on the upper surface of the die island 3a and forming a grinding groove on the back surface of the semiconductor chip 2, lack of wettability with the conductive resin paste 6 can be overcome and dripping of the conductive resin paste 6 to the side surface of the die island 3a can be prevented. Such effects will be described in detail in the manufacturing method of a semiconductor device which will be described later. The above-mentioned concave 8 is also formed at the center portion of the upper surface of the plurality of electrode terminals 3b.

The distance (corresponding to L2 in FIG. 3) from the back surface of the semiconductor chip 2 to the upper surface of the die island 3a closest to the back surface of the semiconductor chip 2 is, for example, from 5 μm to 8 μm. This distance is not limited to it, because it is determined, depending on the grain size of a filler contained in the conductive resin paste 6.

<Manufacturing Method of Semiconductor Device> Next, a manufacturing method of a semiconductor device having 5 pins of external terminals according to First Embodiment of the invention will next be described in the order of steps while referring to FIGS. 4 to 27.

Figure 4:
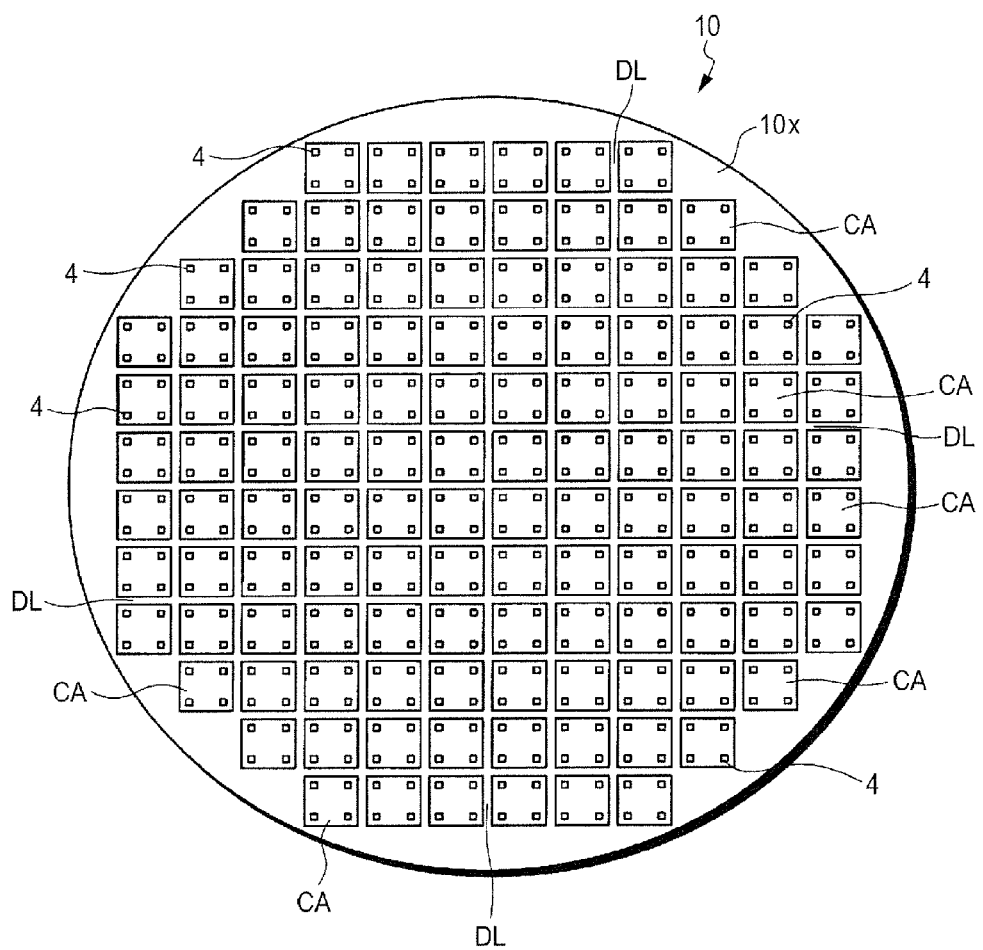
FIG. 4 is a fragmentary top view of a semiconductor wafer in a manufacturing step (wafer providing step) for describing a manufacturing method of the semiconductor device according to First Embodiment of the invention.
Figure 5:
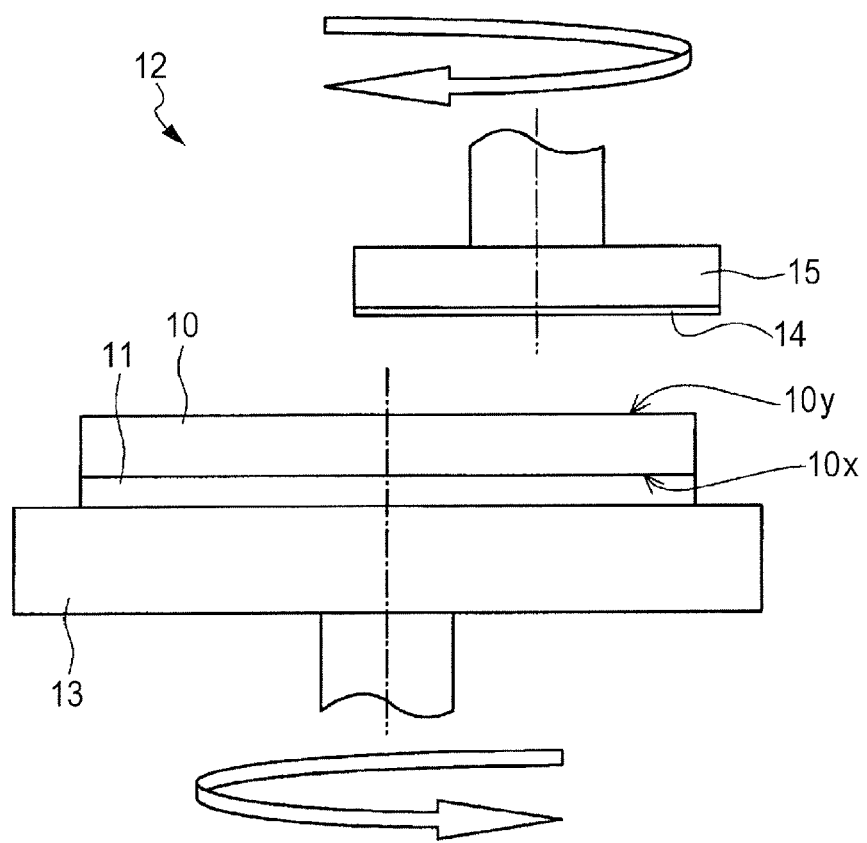
FIG. 5 is a schematic view of a back grinding apparatus to be used for the manufacture of the semiconductor device according to First Embodiment of the invention.
Figure 6:
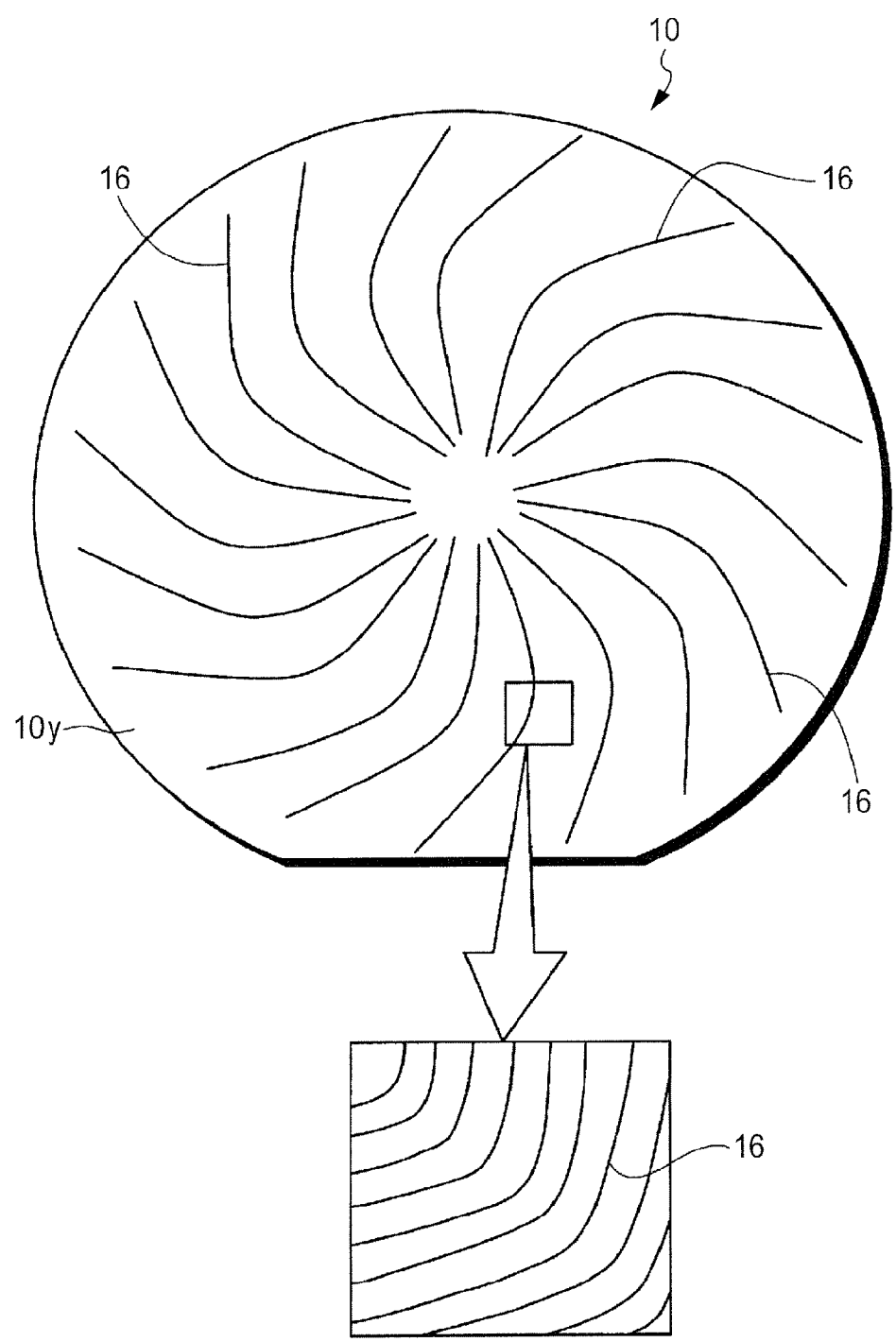
FIG. 6 is a fragmentary view of the back surface of the semiconductor wafer in a manufacturing step (back grinding step) for describing the manufacturing method of the semiconductor device according to First Embodiment of the invention.
Figure 7:
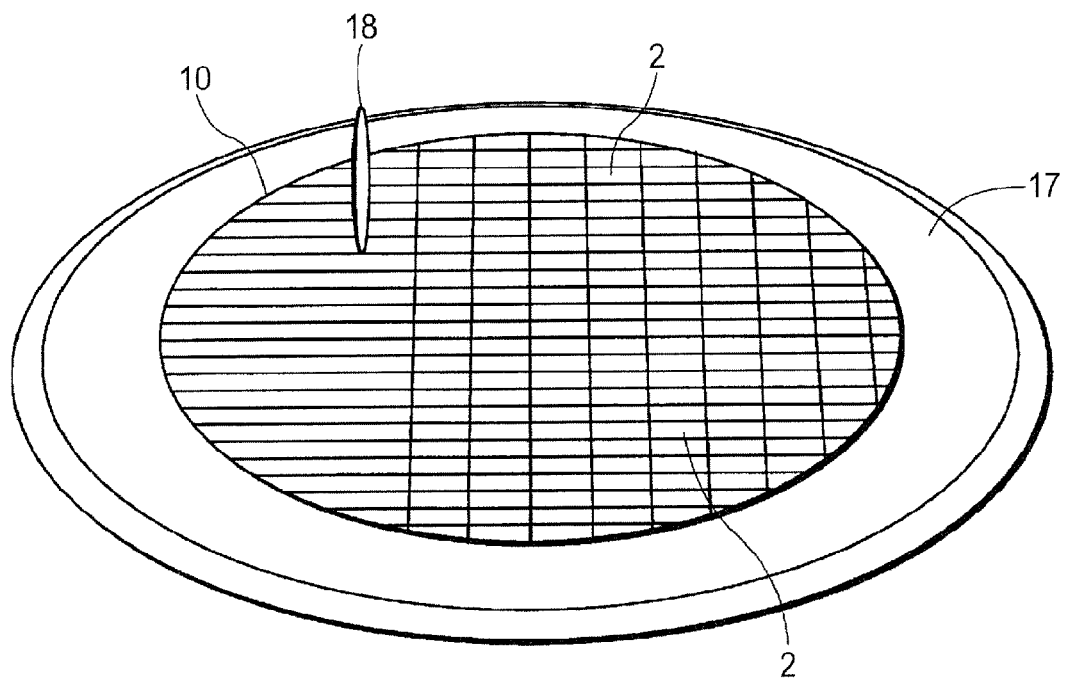
FIG. 7 is a fragmentary top view of the semiconductor wafer in a manufacturing step (wafer dicing step) for describing the manufacturing method of the semiconductor device according to First Embodiment of the invention.
Figure 8:
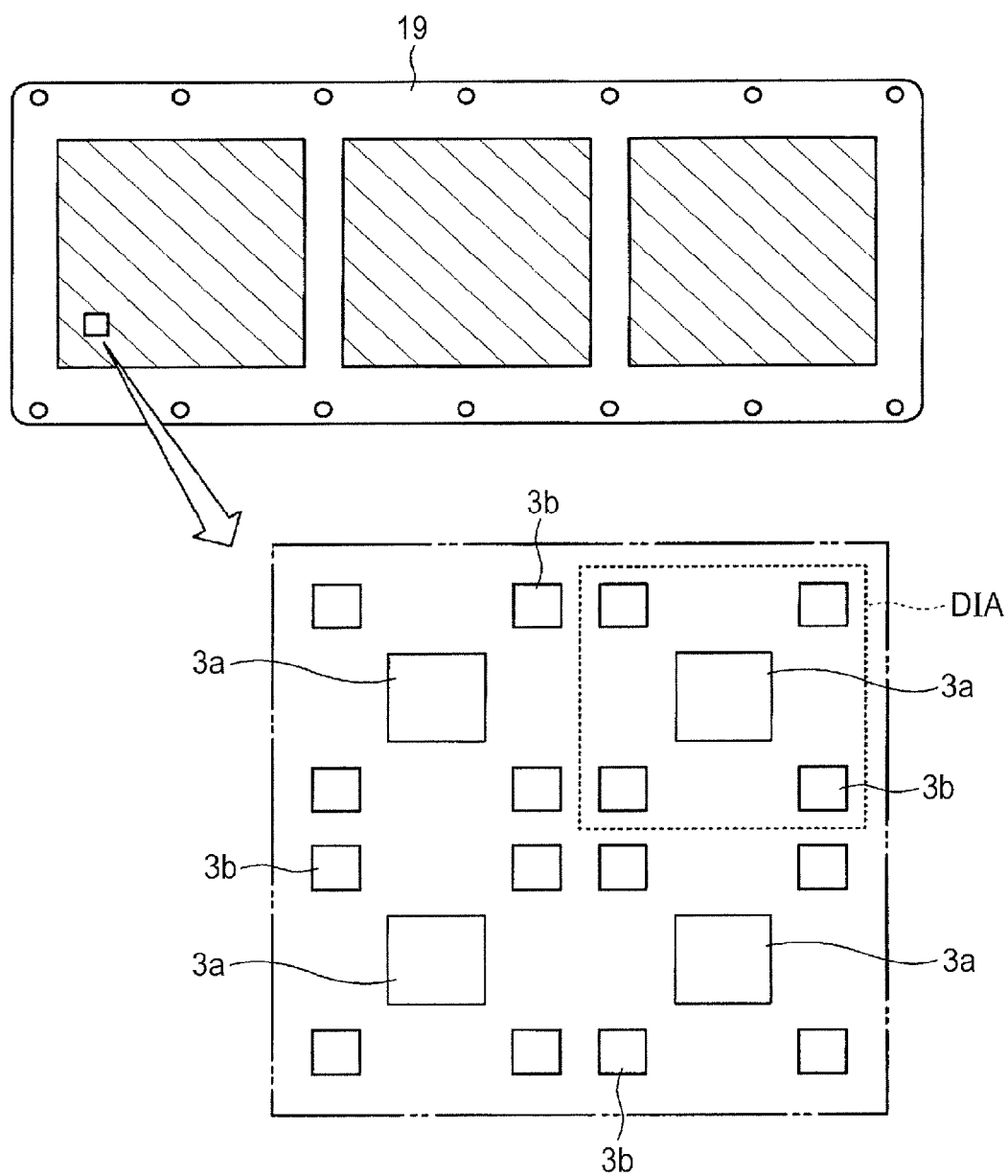
FIG. 8 is a fragmentary top view of a mother substrate according to First Embodiment of the invention.
Figure 9:
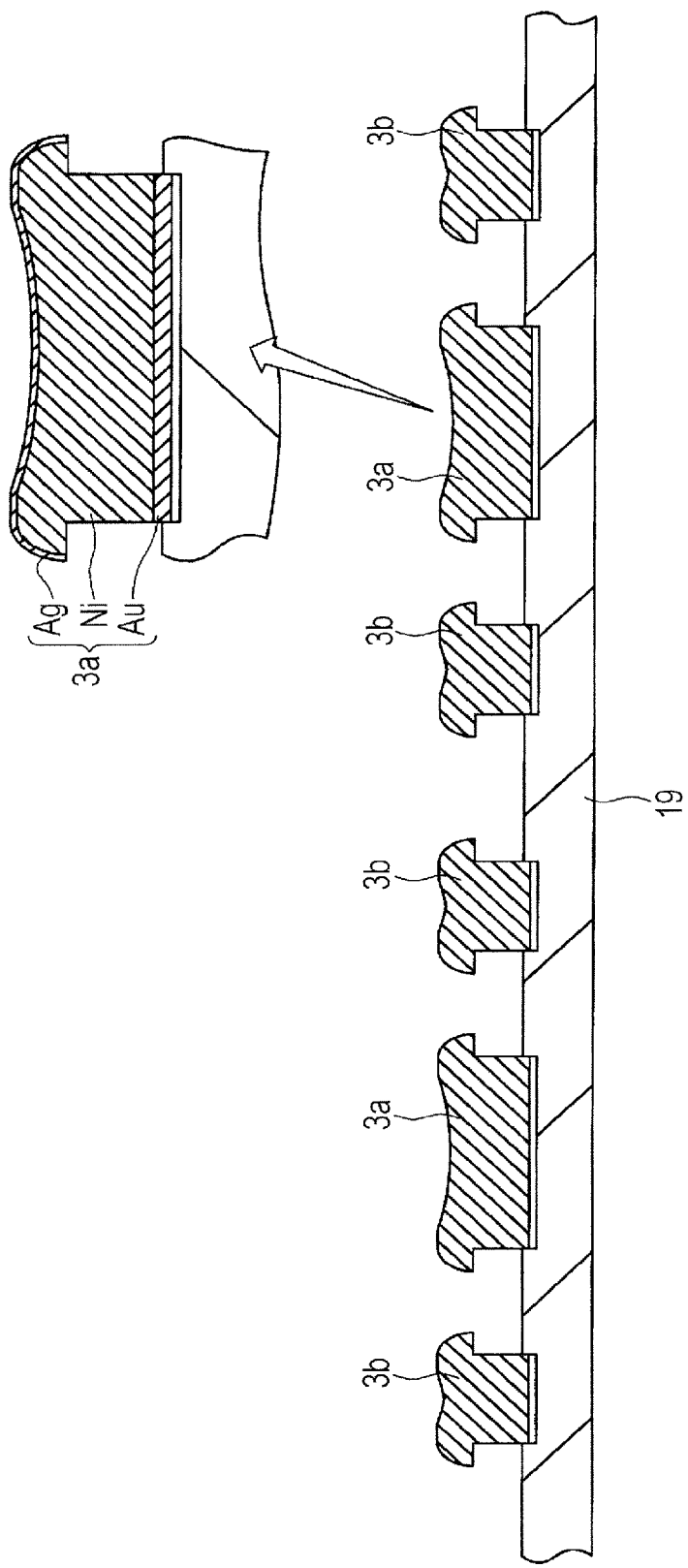
FIG. 9 includes a fragmentary cross-sectional view of the mother substrate according to First Embodiment of the invention and an enlarged fragmentary cross-sectional view of one of die islands.
Figure 10:
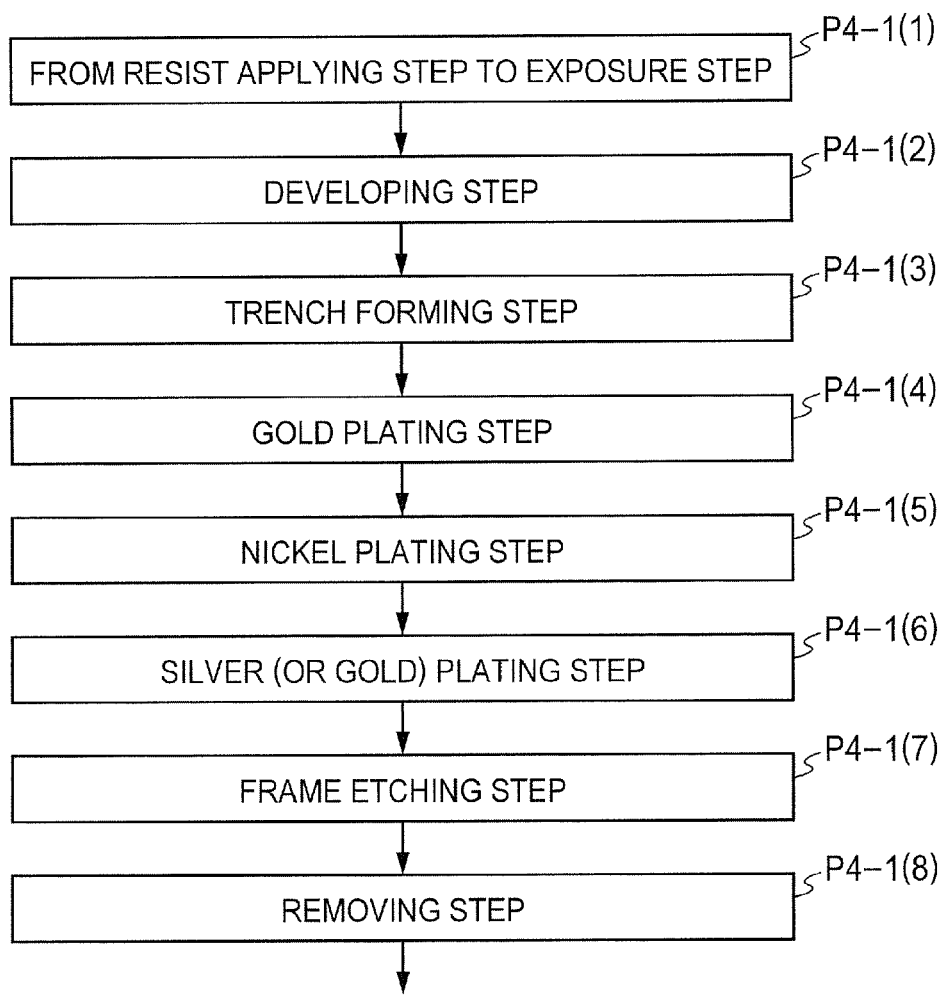
FIG. 10 is a flow chart for describing a manufacturing method of a mother substrate having a plurality of external terminals (a die island and electrode terminals) according to First Embodiment of the invention.
Figure 19:
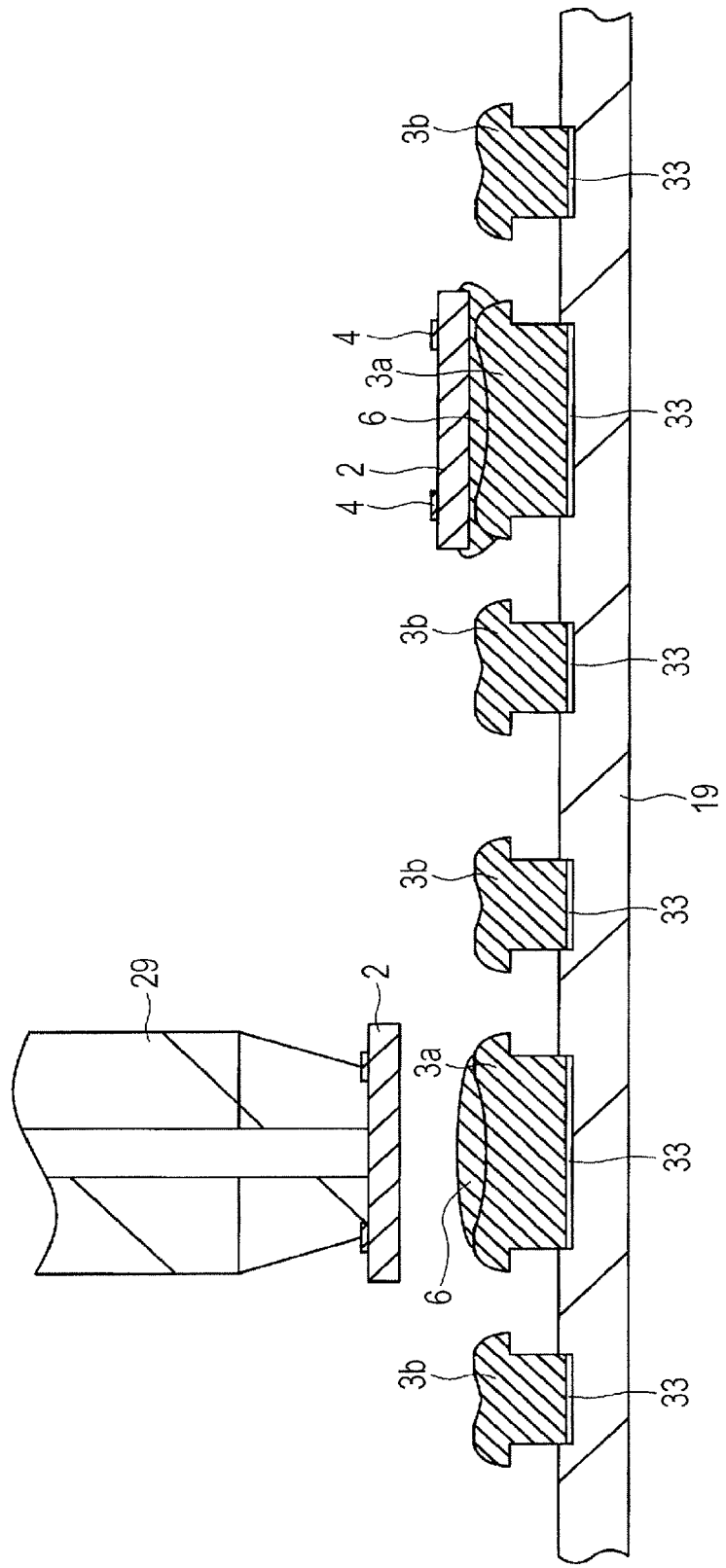
FIG. 19 is a fragmentary cross-sectional view of the mother substrate in a manufacturing step (a die bonding step) for describing the manufacturing method of the semiconductor device according to First Embodiment of the invention.
Figure 20:
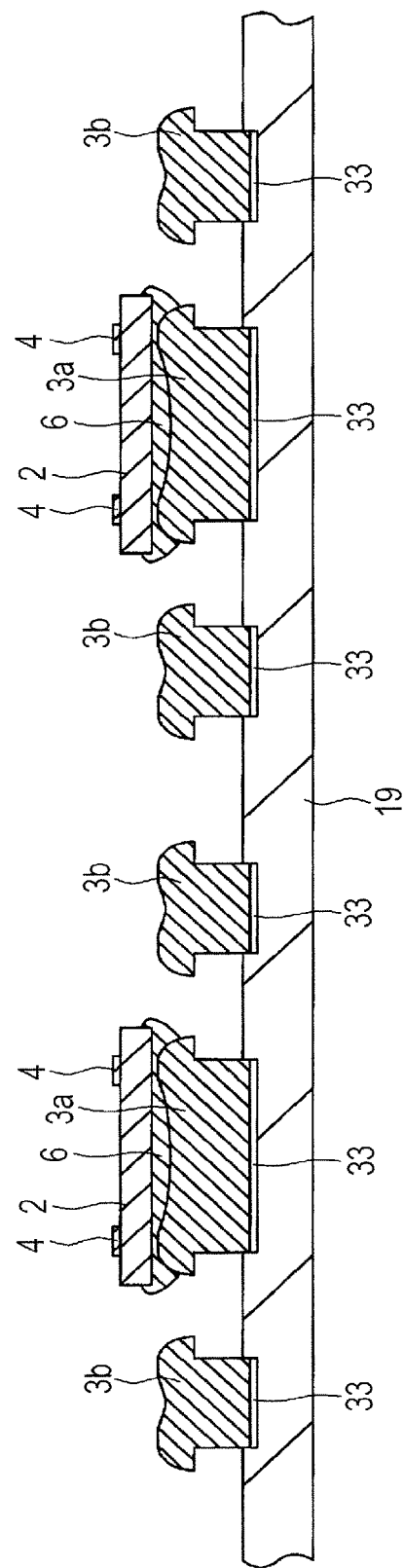
FIG. 20 is a fragmentary cross-sectional view of the mother substrate in a manufacturing step (a conductive resin paste baking step) for describing the manufacturing method of the semiconductor device according to First Embodiment of the invention.
Figure 21:
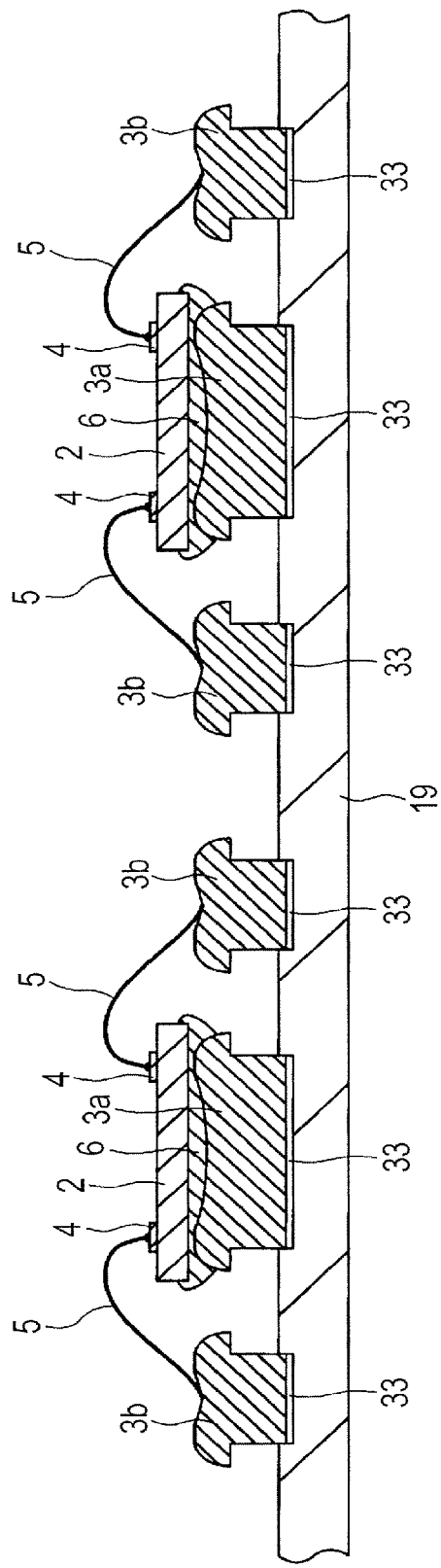
FIG. 21 is a fragmentary cross-sectional view of the mother substrate in a manufacturing step (a wire bonding step) for describing the manufacturing method of the semiconductor device according to First Embodiment of the invention.
Figure 22:
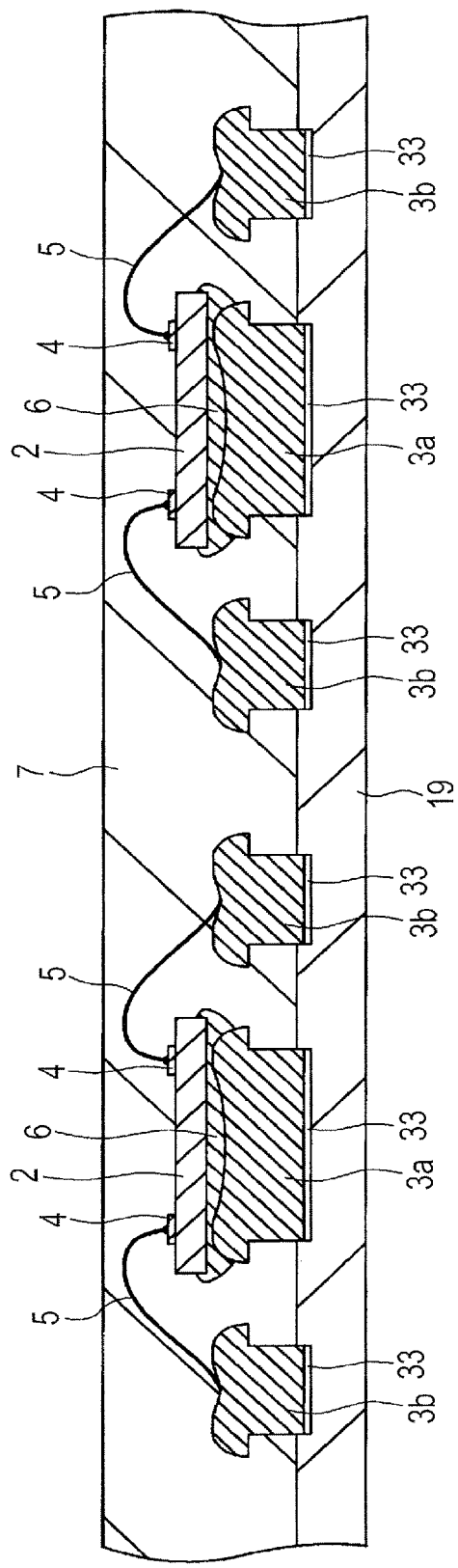
FIG. 22 is a fragmentary cross-sectional view of the mother substrate in a manufacturing step (a molding step) for describing the manufacturing method of the semiconductor device according to First Embodiment of the invention.
Figure 23:
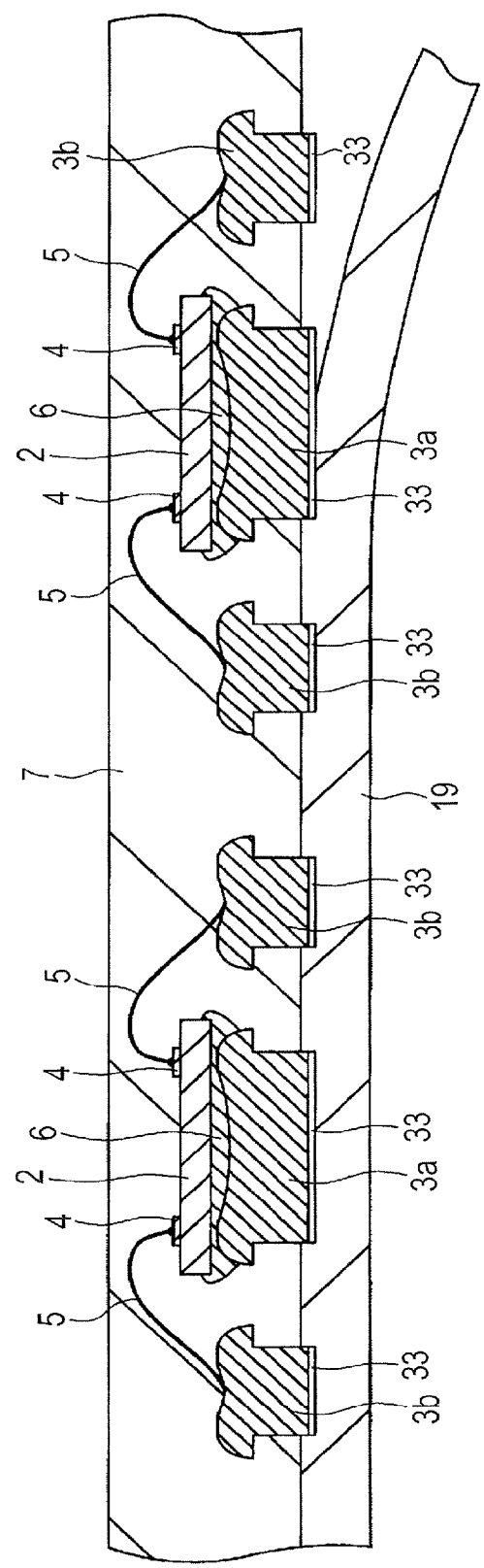
FIG. 23 is a fragmentary cross-sectional view of the mother substrate in a manufacturing step (a mother substrate peeling step) for describing the manufacturing method of the semiconductor device according to First Embodiment of the invention.
Figure 24:
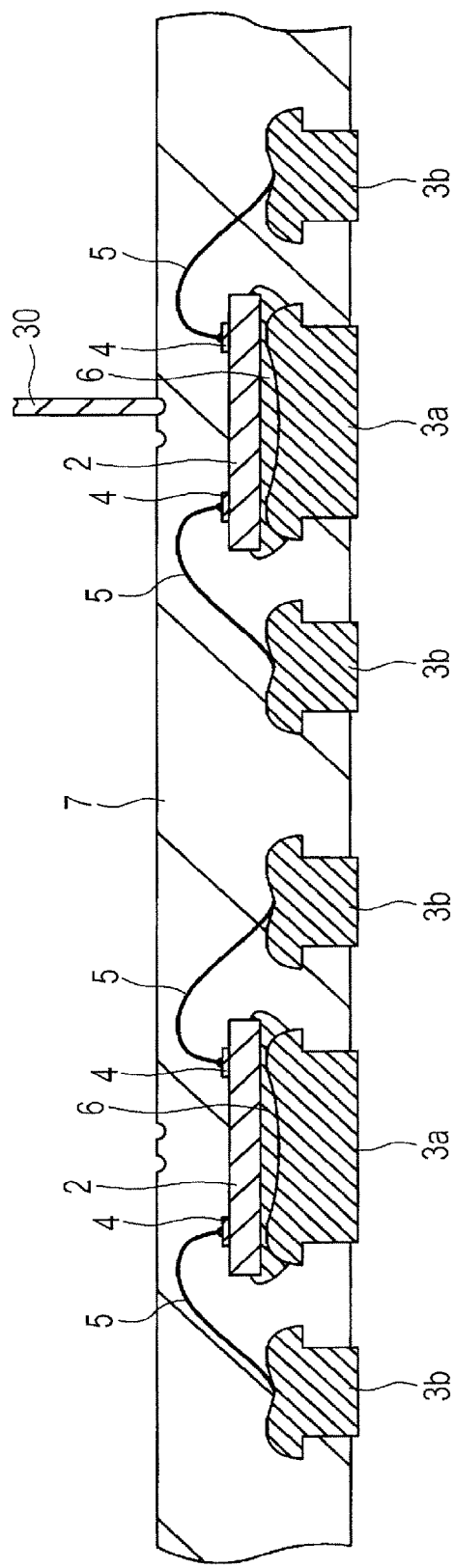
FIG. 24 is a fragmentary cross-sectional view of the mother substrate in a manufacturing step (a laser marking step) for describing the manufacturing method of the semiconductor device according to First Embodiment of the invention.
Figure 25:
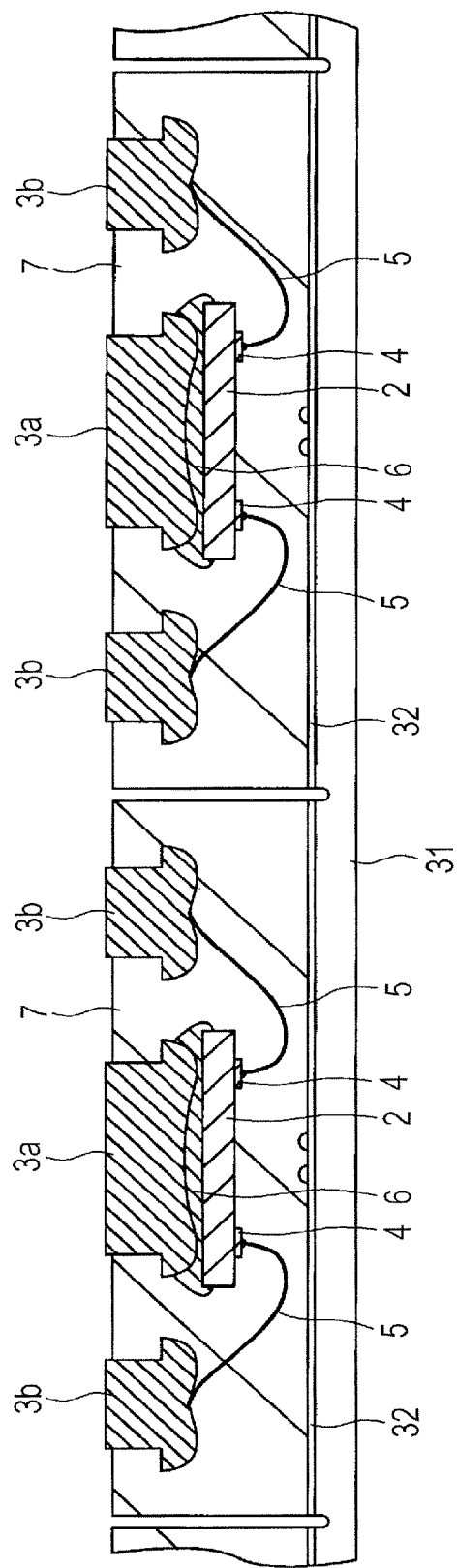
FIG. 25 is a fragmentary cross-sectional view of the mother substrate in a manufacturing step (a package dicing step) for describing the manufacturing method of the semiconductor device according to First Embodiment of the invention.
Figure 26:
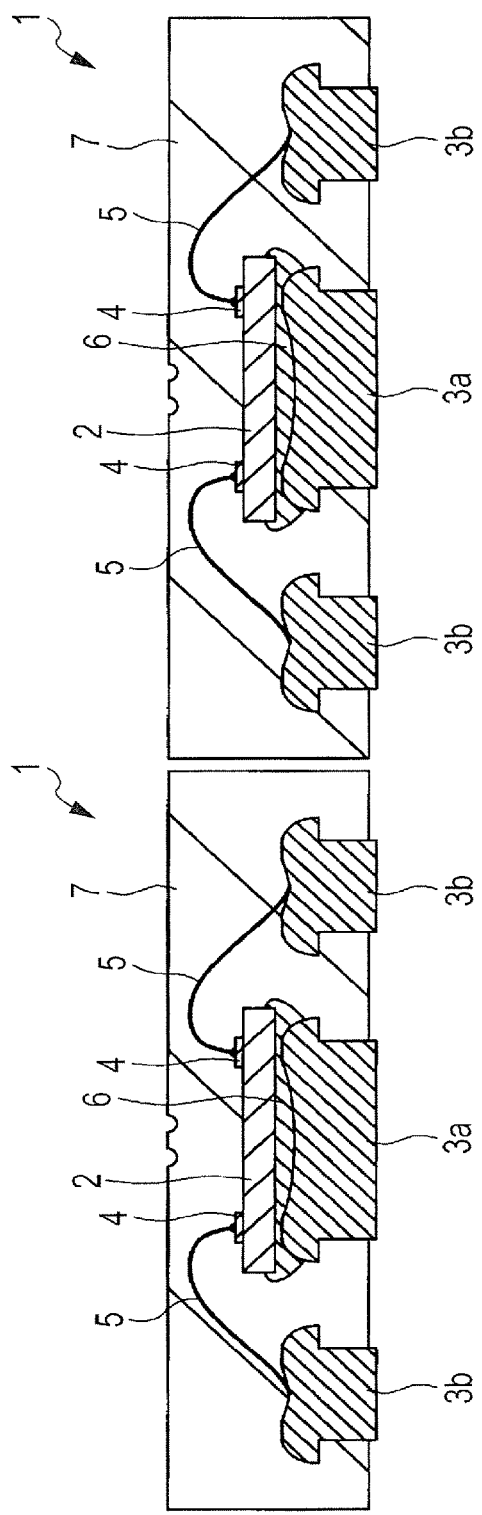
FIG. 26 is a fragmentary cross-sectional view of the mother substrate in a manufacturing step (a dicing sheet removing step) for describing the manufacturing method of the semiconductor device according to First Embodiment of the invention.
Figure 27:
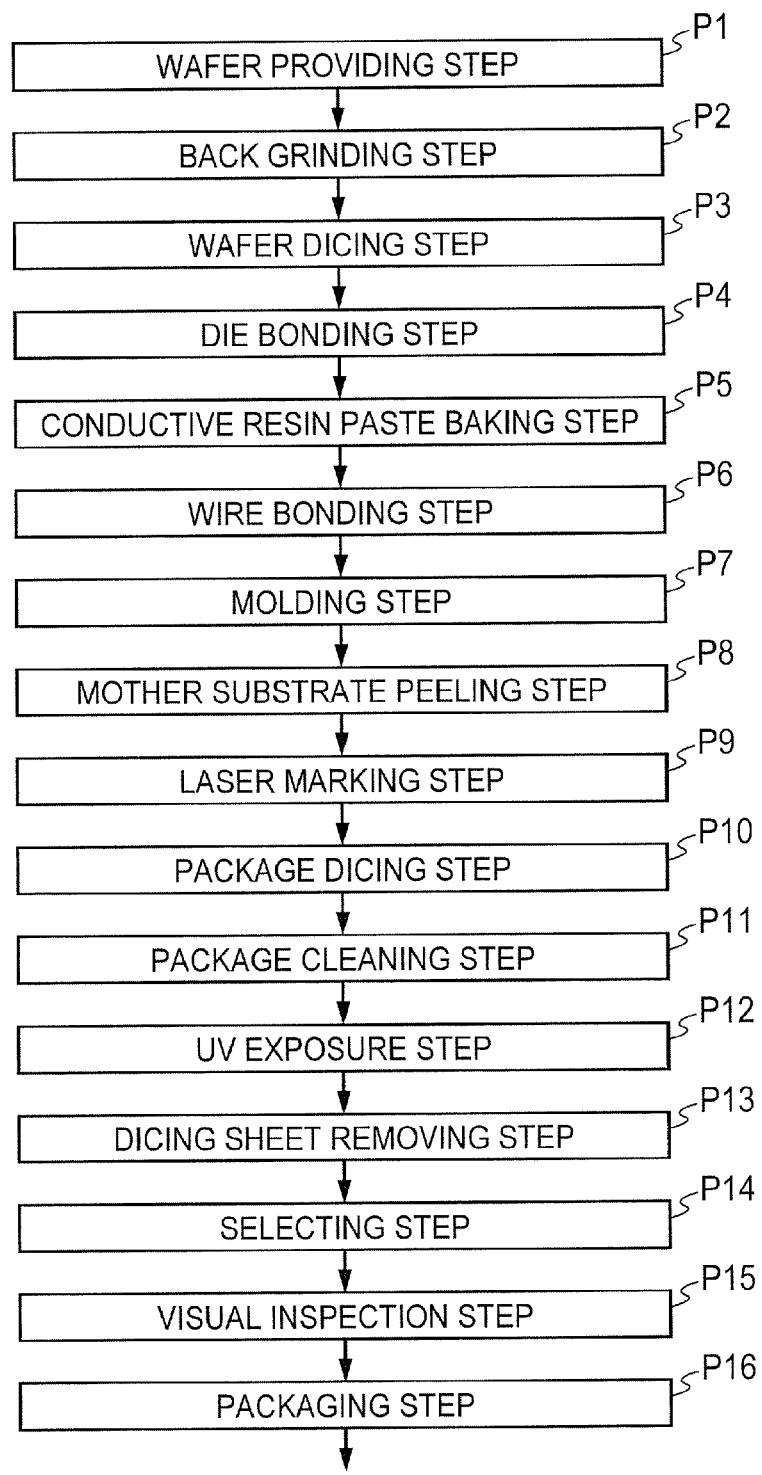
FIG. 27 is a flow chart for describing the manufacturing method of the semiconductor device according to First Embodiment of the invention.

FIG. 4 is a fragmentary top view of a semiconductor wafer in a wafer providing step; FIG. 5 is a schematic view of a back grinding apparatus to be used for the manufacture of the semiconductor device; FIG. 6 is a fragmentary view of the back surface of the semiconductor wafer in a back grinding step; FIG. 7 is a fragmentary top view of the semiconductor wafer in a wafer dicing step; FIGS. 8 to 19 are views for describing a die bonding step, in which FIG. 8 is a fragmentary top view of a mother substrate, FIG. 9 is a fragmentary cross-sectional view of the mother substrate, FIG. 10 is a flow chart for describing a manufacturing method of a mother substrate having a plurality of external terminals (a die island and electrode terminals), FIGS. 11 to 18 are fragmentary cross-sectional views of the mother substrate in each manufacturing step for describing the manufacturing method of the mother substrate having the plurality of external terminals (a die island and electrode terminals), and FIG. 19 is a fragmentary cross-sectional view of the mother substrate in a die bonding step; FIG. 20 is a fragmentary cross-sectional view of the mother substrate in a conductive resin paste baking step; FIG. 21 is a fragmentary cross-sectional view of the mother substrate in a wire bonding step; FIG. 22 is a fragmentary cross-sectional view of the mother substrate in a molding step; FIG. 23 is a fragmentary cross-sectional view of the mother substrate in a mother substrate peeling step; FIG. 24 is a fragmentary cross-sectional view of the mother substrate in a laser marking step; FIG. 25 is a fragmentary cross-sectional view of the mother substrate in a package dicing step; FIG. 26 is a fragmentary cross-sectional view of the mother substrate in a dicing sheet removing step; and FIG. 27 is a flow chart for describing the method of manufacturing a semiconductor device.

Here, a method of manufacturing a semiconductor device having 5 pins of external terminals (1 pin of a die island and 4 pins of electrode terminals) will be described, but the invention is not limited thereto but can also be applied to a method of manufacturing a semiconductor device having, for example, 2 pins of external terminals or 7 pins of external terminals.

<Wafer Providing Step P1> First, as shown in FIG. 4, a semiconductor wafer 10 is provided. The semiconductor wafer 10 is made of single crystal silicon and has a diameter of, for example, 200 mm or 300 mm and thickness (first thickness) of, for example, 0.7 mm or greater (thickness at the time when provided for manufacturing steps). The semiconductor wafer 10 has a first main surface (surface) 10x, a plurality of chip regions CA partitioned in matrix on the first main surface 10x, cutting regions (scribe regions, dicing regions, dicing lines) DL formed between two adjacent chip regions CA among the plurality of chip regions CA, and a second main surface (back surface) on the side opposite to the first main surface 10x.

Each chip region CA on the first main surface 10x of the semiconductor wafer 10 has an integrated circuit comprised of a plurality of semiconductor elements, a multilayer wiring layer obtained by stacking a plurality of insulating layers and a plurality of wiring layers, and a surface protecting film formed to cover the multilayer wiring layer, though not limited to it. The insulating layer is made of, for example, a silicon oxide film. The wiring layer is made of a metal film, for example, aluminum (Al), tungsten (W), or copper (Cu). The surface protecting film is made of a multilayer film obtained by stacking an inorganic insulating film such as silicon oxide film or silicon nitride film and an organic insulating film. In each chip region CA on the first main surface 10x of the semiconductor wafer 10, a plurality of bonding pads (electrode pads, surface electrodes) 4 electrically coupled to the plurality of semiconductor elements are placed along each side of each chip region CA. The bonding pads 4 are each made of a wiring of the uppermost layer of the multilayer wiring layers and exposed by an opening portion formed corresponding to the bonding pad 4 in the surface protecting film.

<Back Grinding Step P2>Next, the semiconductor wafer 10 is thinned to a predetermined thickness (second thickness) by grinding the second main surface of the semiconductor wafer 10 with a grinding material.

For the grinding of the second main surface of the semiconductor wafer 10, for example, a back grinding apparatus 12 as shown in FIG. 5 is used. This back grinding apparatus 12 is equipped with a chuck table 13 which rotates with the semiconductor wafer 10 thereon and a wheel 15 for holding therewith a grinding material 14 above the position opposite to the upper surface of the chuck table 13.

First, a protecting tape (back grinding tape) 11 for covering the integrated circuit is attached to the semiconductor wafer 10 on the side of the first main surface 10x.

Next, the semiconductor wafer 10 is placed on the upper surface of the chuck table 13 via the protecting tape 11 while facing the upper surface of the chuck table 13 of the back grinding apparatus 12 and the first main surface 10x of the semiconductor wafer 10 each other.

Next, the chuck table 13 is rotated and the wheel 15 for holding the grinding material (for example, diamond wheel) 14 is rotated. Under such a state, a second main surface 10y of the semiconductor wafer 10 is ground using the grinding material 14 by the rotation movement of the chuck table 13 and the rotation movement of the wheel 15 while supplying slurry to the second main surface 10y of the semiconductor wafer 10. By this grinding, the thickness of the semiconductor wafer 10 is reduced to a predetermined finished thickness (second thickness) and moreover, many grinding grooves are left on the second main surface 10y. Some of the grinding grooves can be visually recognized. The grinding material 14 used in this grinding has roughness of, for example, from #320 to #4000, of which a roughness range with #12000 as a center is preferred. The finished thickness (second thickness) of the semiconductor wafer 10 is, for example, from 0.1 mm to 0.3 mm.

After that, the semiconductor wafer 10 is cleaned to remove the abrasive grains and contaminants attached to the second main surface 10y of the semiconductor wafer 10.

FIG. 6 is a fragmentary plan view for describing the second main surface 10y of the semiconductor wafer 10 after grinding. Many grinding grooves 16, some of which are visible, have remained in the second main surface 10y of the semiconductor wafer 10. For example when the second main surface 10y of the semiconductor wafer 10 is ground with the grinding material 14 with roughness of #2000, the roughness of the second main surface 10y is, for example, about 0.2 μm in terms of the maximum height Ry (sum of the height of the highest summit and the depth of the deepest valley from the average line of a standard length portion sampled from the roughness curve in the direction thereof).

In the present embodiment, the semiconductor wafer 10 is thinned to a predetermined finished thickness (second thickness) and at the same time, many grinding grooves 16 are left in the second main surface 10y by single grinding. It is also possible to conduct grinding twice, that is, first grinding (rough grinding) to reduce the thickness of the semiconductor wafer 10 to a thickness near the finished thickness (second thickness) and second grinding (finish grinding) for leaving many grinding grooves 16 intentionally. Described specifically, the semiconductor wafer 10 is ground into a thickness near the finish thickness (second thickness) with a rough grinding material (for example, from #320 to #360) 14 in the first grinding (rough grinding), followed by second grinding (finish grinding) using a grinding material (for example, from #500 to #4000) finer than the grinding material used in the first grinding (rough grinding). This makes it possible to decrease the time necessary for grinding and at the same time, leave the desired number of grinding grooves 16 having a desired depth.

The grinding grooves 16 which have been left in the second main surface 10y of the semiconductor wafer 10 are left without removing the grinding grooves 16 in the second main surface 10y of the semiconductor wafer 10 by using, for example, spin etch or CMP (Chemical Mechanical Polishing).

<Wafer Dicing Step P3>Next, as shown in FIG. 7, a circular frame 17 with a dicing tape attached thereto in advance is provided and the semiconductor wafer 10 is bonded to the upper surface of this dicing tape with the first main surface 10x of the semiconductor wafer 10 up. Then, the semiconductor wafer 10 is diced vertically and horizontally along the cutting region DL by using an ultrathin circular dicing blade 18 having diamond fine grains attached thereto. The semiconductor wafer 10 is diced into individual semiconductor chips 2. Even after individualization, the semiconductor chips 2 are fixed onto the frame 17 with the dicing tape so that they are still aligned in order.

Then, the dicing tape is exposed to ultraviolet rays from the lower surface side thereof to reduce the adhesion of the adhesive layer and facilitate peeling of each of the semiconductor chips 2 from the dicing tape.

<Die Bonding Step P4>[P4-1: Base Material Providing Step] Next, as shown in FIG. 8, a mother substrate (substrate, base material, matrix) 19 is provided. The mother substrate 19 is made of a conductive member, for example, stainless (SUS430) or copper (Cu) and it is a multi-chip substrate in which regions (chip mounting regions DIA) each having one semiconductor chip 2 have been arranged in matrix form. FIG. 8 shows a mother substrate 19 having three blocks, each block comprised of a plurality of chip mounting regions DIA. The mother substrate 19 has a thickness of, for example, 0.15 mm.

The mother substrate 19 has, at the center of one of the chip mounting regions DIA on the upper surface (surface, chip mounting surface) thereof, one pin of die island (first electrode plate) 3a and, at the periphery thereof, a plurality (four pins in this embodiment) of electrode terminals (second electrode plates, electrodes) 3b.

As shown in FIG. 9, the die island 3a and the electrode terminals 3b are each comprised of a film stack obtained by successively stacking a gold (Au) film, a nickel (Ni) film, and a silver (Ag) or gold (Au) film one after another in this order, for example, by electroplating and they have a mushroom-like shape with the nickel (Ni) film being canopied. Although the upper surfaces (the surfaces) of the die island 3a and the electrode terminals 3b are at positions higher than the upper surface of the mother substrate 19, the die island 3a and the electrode terminals 3b can be formed, by electroplating, with a thickness not greater than about half of the thickness of a lead made of a portion of a leadframe formed by patterning a conductive substrate (metal plate). In addition, the die island 3a and the electrode terminals 3b each having a mushroom-like shape can be expected to have an anchor effect of the die island 3a and the electrode terminals 3b in a molding step P7, that is, a manufacturing step conducted later. The thicknesses of the gold (Au) film, the nickel (Ni) film, and the silver (Ag) or gold (Au) film constituting the die island 3a and the electrode terminals 3b are, for example, 0.1 µm or greater, from 50 to 80 µm, and 2.5 µm or greater, respectively.

Next, a method of manufacturing the mother substrate 19 having thereon the die island 3a and the electrode terminals 3b will be described referring to FIGS. 10 to 18. FIG. 10 is a flow chart for describing the method of manufacturing the mother substrate 19 having thereon the die island 3a and the electrode terminals 3b; and FIGS. 11 to 18 are fragmentary cross-sectional views of the mother substrate in each manufacturing step for describing the method of manufacturing the mother substrate 19 having the die island 3a and the electrode terminals 3b.

P4-1(1): Resist Applying Step to Exposure Step

Figure 11:
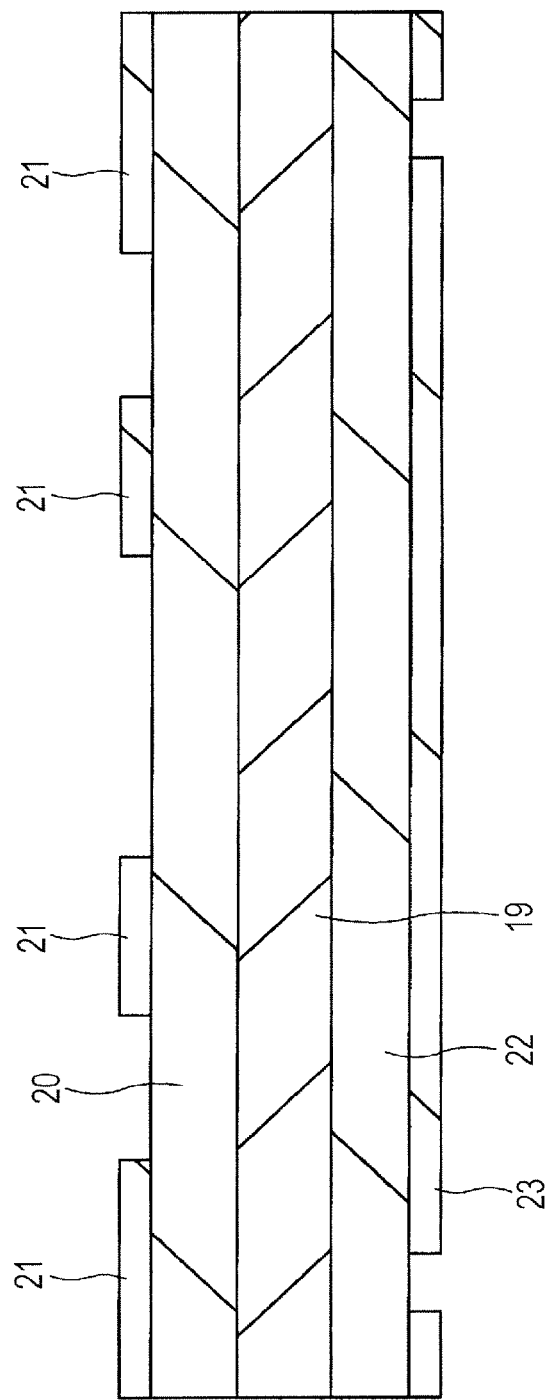
FIG. 11 is a fragmentary cross-sectional view of the mother substrate in a manufacturing step for describing the manufacturing method of the mother substrate having a plurality of external terminals (a die island and electrode terminals) according to First Embodiment of the invention.

As shown in FIG. 11, after application of a resist film 20 onto the upper surface of the mother substrate 19, the resist film 20 is exposed to ultraviolet rays via a film mask 21 having a predetermined pattern. Similarly, after application of a resist film 22 onto a lower surface (back surface) on the side opposite to the upper surface of the mother substrate 19, the resist film 22 is exposed to ultraviolet rays via a film mask 23 having a predetermined pattern.

P4-1(2): Developing Step

Figure 12:
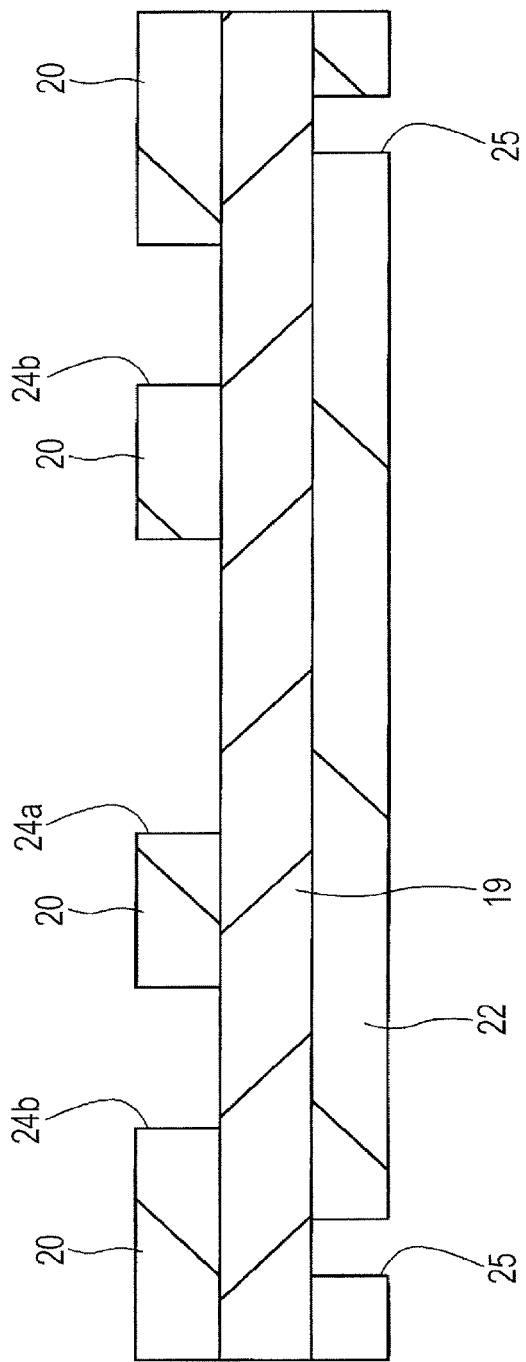
FIG. 12 is a fragmentary cross-sectional view (a fragmentary cross-sectional view following FIG. 11 showing a portion similar to that shown in FIG. 11) of the mother substrate in a manufacturing step for describing the manufacturing method of the mother substrate having a plurality of external terminals (a die island and electrode terminals) according to First Embodiment of the invention.

As shown in FIG. 12, after removal of the film masks 21 and 23, development treatment is given to pattern the resist film 20 applied to the upper surface of the mother substrate 19 and the resist film 22 applied to the lower surface of the mother substrate 19. In the resist film 20 applied onto the upper surface of the mother substrate 19, a die-island hole 24a for forming the die island 3a therein and an electrode-terminal hole 24b for forming the electrode terminal 3b therein are formed. In addition, a guide hole 25 is formed in the resist film 22 applied onto the lower surface of the mother substrate 19. The die-island hole 24a is formed so that the vertical (first direction) and horizontal (second direction) sizes of it, when viewed from the top, are smaller than the vertical (first direction) and horizontal (second direction) sizes of the semiconductor chip 2 when viewed from the top.

P4-1(3): Trench Forming Step

Figure 13:
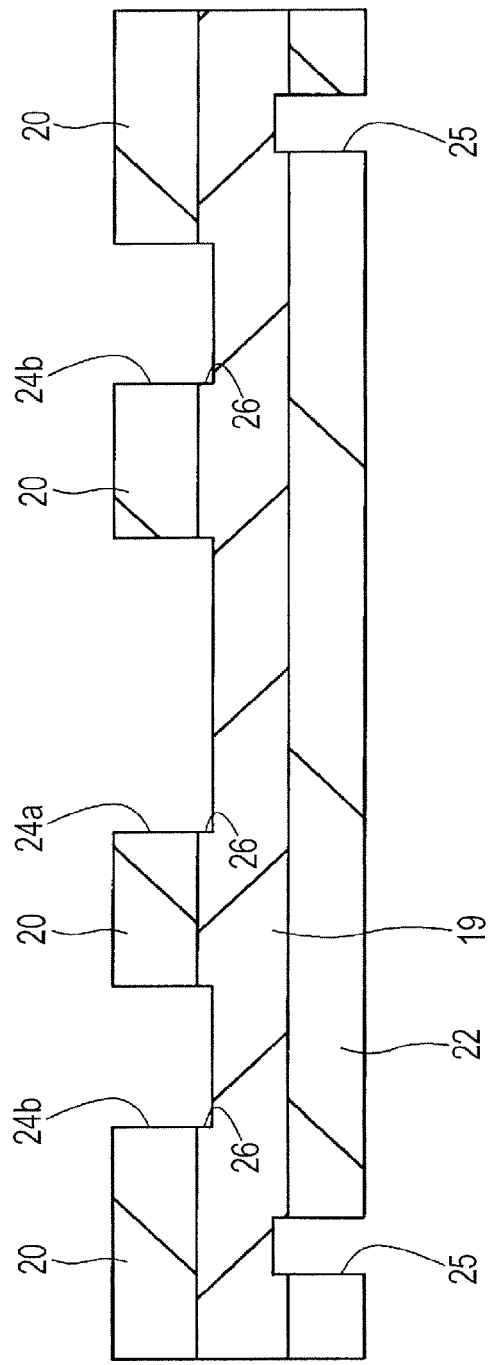
FIG. 13 is a fragmentary cross-sectional view (a fragmentary cross-sectional view following FIG. 12 showing a portion similar to that shown in FIG. 11) of the mother substrate in a manufacturing step for describing the manufacturing method of the mother substrate having a plurality of external terminals (a die island and electrode terminals) according to First Embodiment of the invention.

As shown in FIG. 13, by etching with the resist film 20 as a mask, a trench 26 is formed in the mother substrate 19 exposed from the bottoms of the die-island hole 24a and the electrode-terminal hole 24b. The trench has a depth of, for example, about 3 µm.

P4-1(4): Gold Plating Step

Figure 14:
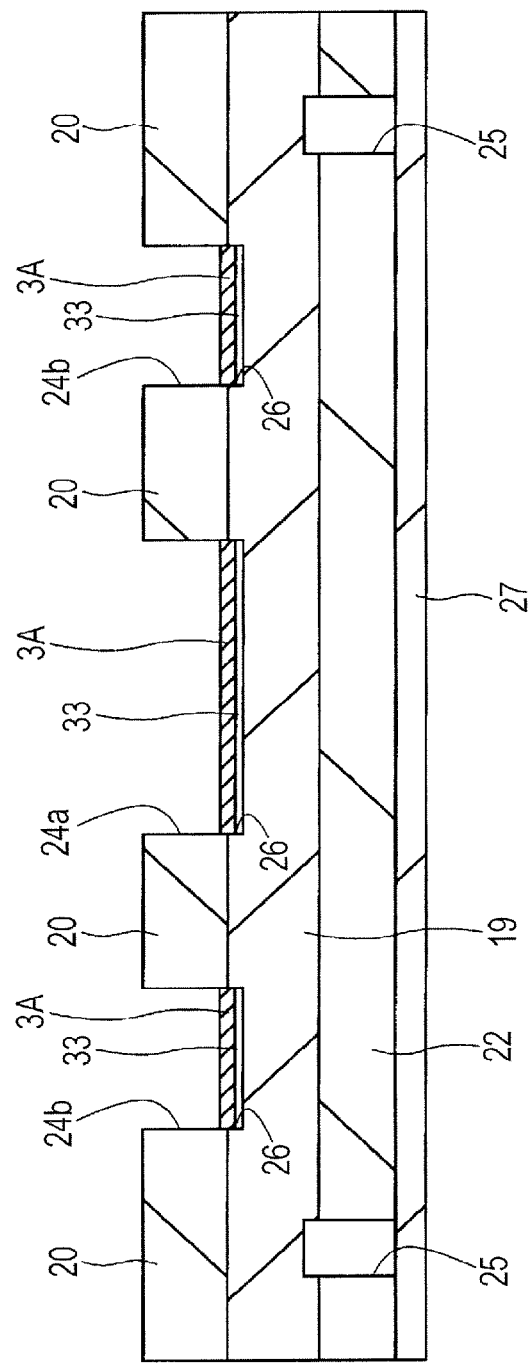
FIG. 14 is a fragmentary cross-sectional view (a fragmentary cross-sectional view following FIG. 13 showing a portion similar to that shown in FIG. 11) of the mother substrate in a manufacturing step for describing the manufacturing method of the mother substrate having a plurality of external terminals (a die island and electrode terminals) according to First Embodiment of the invention.

As shown in FIG. 14, after the surface of the resist film 22 formed on the lower surface of the mother substrate 19 is covered with a protecting film 27, a gold (Au) film 3A is formed (deposited) by electroplating on the bottoms of the die-island hole 24a and the electrode-terminal hole 24b, each formed on the upper surface of the mother substrate 19. The gold (Au) film 3A has a thickness of, for example, 0.1 µm. In order to prevent the die island 3a or the electrode terminal 3b from remaining on the side of the mother substrate 19 when the mother substrate 19 is peeled from a resin molding 7 in a mother substrate peeling step P8 which will be conducted later, a film 33 may be formed, prior to the formation of the gold (Au) film 3A, on the bottoms of the die-island hole 24a and the electrode-terminal hole 24b, each formed on the upper surface of the mother substrate 19.

P4-1 (5): Nickel Plating Step

Figure 15:
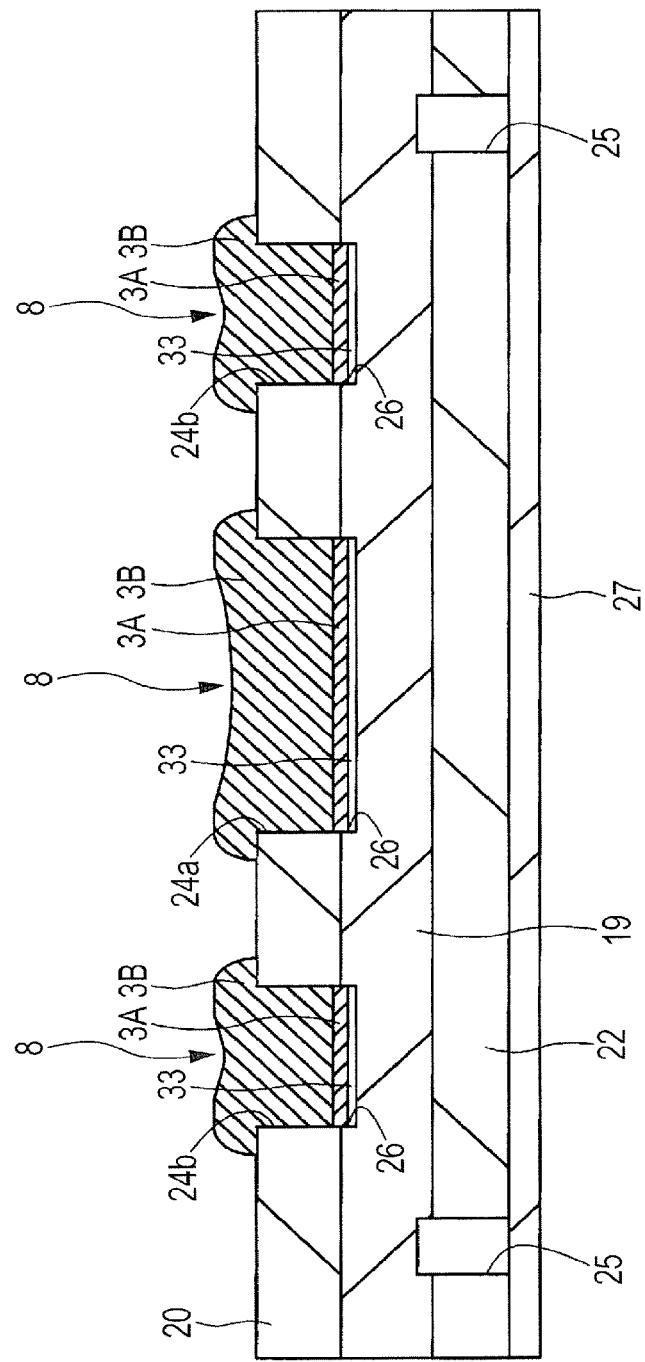
FIG. 15 is a fragmentary cross-sectional view (a fragmentary cross-sectional view following FIG. 14 showing a portion similar to that shown in FIG. 11) of the mother substrate in a manufacturing step for describing the manufacturing method of the mother substrate having a plurality of external terminals (a die island and electrode terminals) according to First Embodiment of the invention.

As shown in FIG. 15, a nickel (Ni) film 3B is formed (deposited) by electroplating so as to be brought into contact with the gold (Au) film 3A in the die-island hole 24a and the electrode-terminal hole 24b, each formed on the upper surface of the mother substrate 19. This nickel (Ni) film 3B is formed not only in the die-island hole 24a and in the electrode-terminal hole 24b but also spreads over the surface of the resist film 20 so that it has a mushroom-like shape with an overhang (a canopied site). This nickel (Ni) film 3B has a thickness of, for example, about 60 µm.

A concave (recess) 8 is then formed at the center portion of the upper surface of the nickel (Ni) film 3B formed in the die-island hole 24a. The depth from the edge of the concave 8 to the bottom of the concave 8 is, for example, from 3 µm to 10 µm. Similarly, a concave 8 having a depth of, for example, from 3 µm to 10 µm is also formed at the center portion of the upper surface of the nickel (Ni) film 3B formed in the electrode-terminal hole 24b.

P4-1 (6): Silver (or Gold) Plating Step

Figure 16:
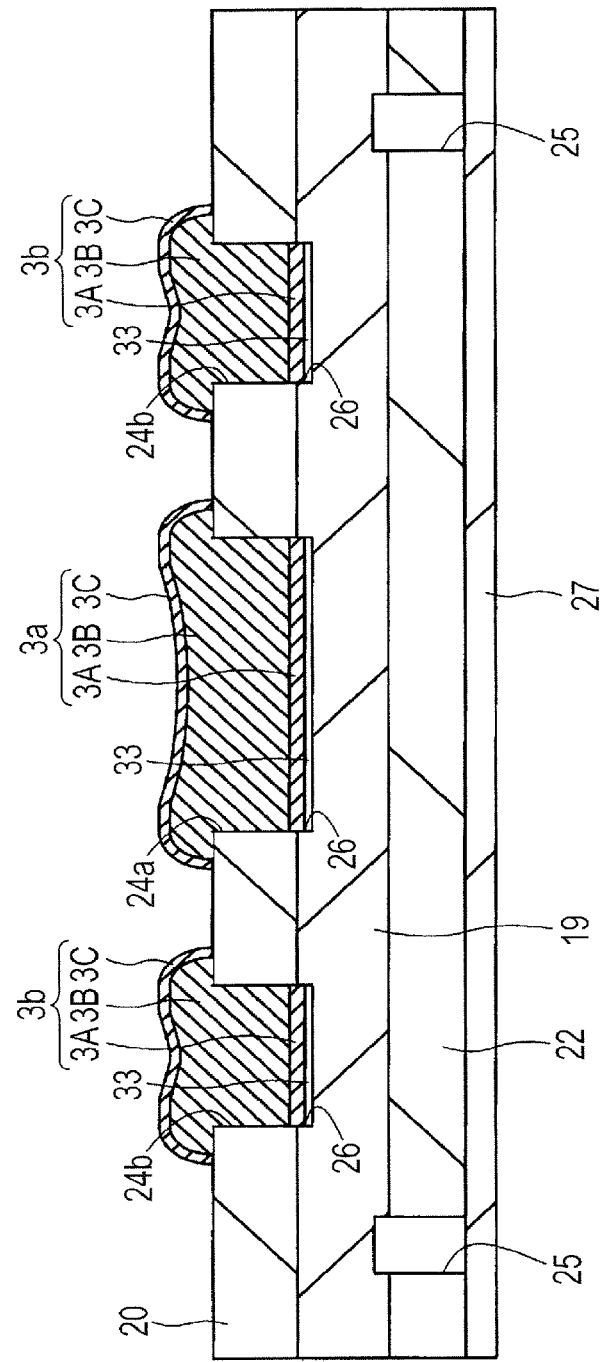
FIG. 16 is a fragmentary cross-sectional view (a fragmentary cross-sectional view following FIG. 15 showing a portion similar to that shown in FIG. 11) of the mother substrate in a manufacturing step for describing the manufacturing method of the mother substrate having a plurality of external terminals (a die island and electrode terminals) according to First Embodiment of the invention.

As shown in FIG. 16, a silver (Ag) film (or a gold (Au) film) 3C is formed (deposited) by electroplating along the surface shape of the nickel (Ni) film 3B formed on the upper surface of the mother substrate 19 and in contact with the surface of the nickel (Ni) film 3B. The thickness of the silver (Ag) film (or gold (Au) film) 3C is, for example, 3 µm. In the present embodiment, the gold (Au) film 3A, the nickel (Ni) film 3B, and the silver (Ag) film (or gold (Au) film) 3C formed by electroplating are described above, but they may be formed by electroless plating. In consideration of the forming rate (deposition rate) of these platings, electroplating is preferred.

P4-1 (7): Frame Etching Step

Figure 17:
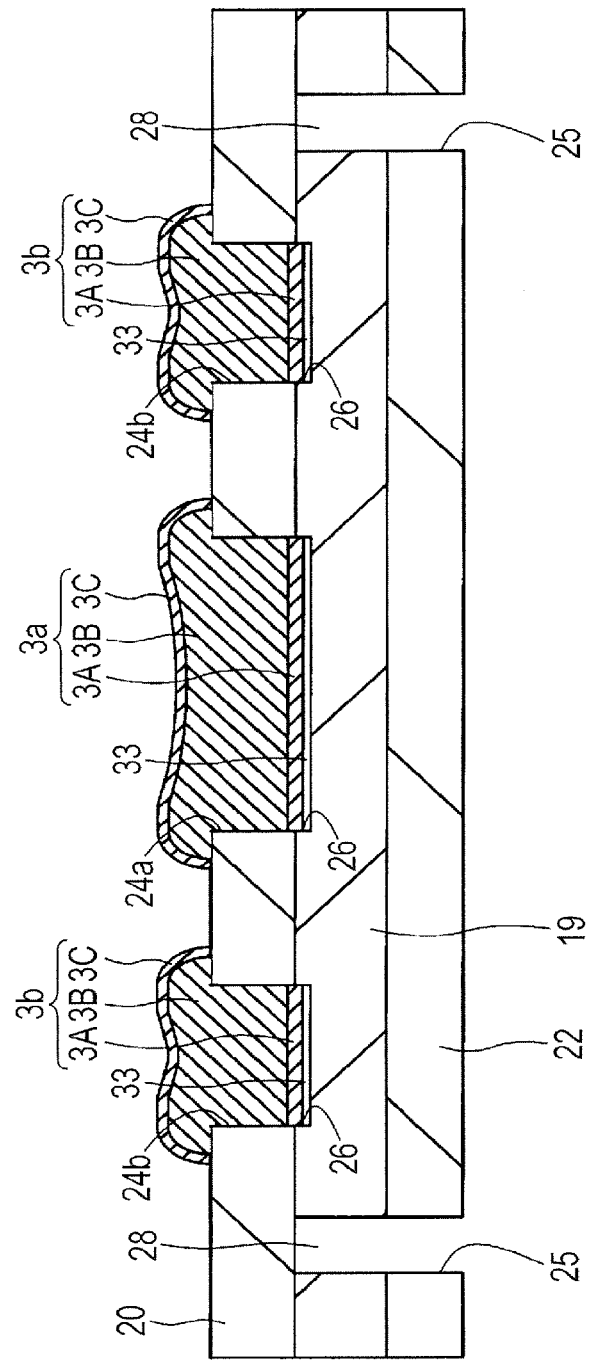
FIG. 17 is a fragmentary cross-sectional view (a fragmentary cross-sectional view following FIG. 16 showing a portion similar to that shown in FIG. 11) of the mother substrate in a manufacturing step for describing the manufacturing method of the mother substrate having a plurality of external terminals (a die island and electrode terminals) according to First Embodiment of the invention.

As shown in FIG. 17, after removal of the protecting film 27 from the surface of the resist film 22 formed on the lower surface of the mother substrate 19, the mother substrate 19 is etched with the resist film 22 as a mask, by which an outer frame 28 of the mother substrate 19 corresponding to the guide hole 25 formed in the resist film 22 is formed.

P4-1 (8): Removing Step

Figure 18:
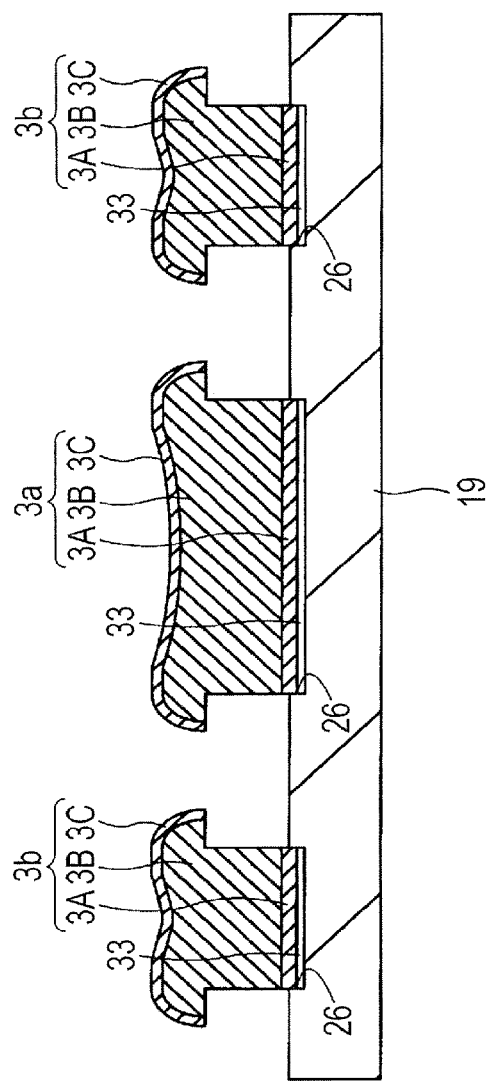
FIG. 18 is a fragmentary cross-sectional view (a fragmentary cross-sectional view following FIG. 17 showing a portion similar to that shown in FIG. 11) of the mother substrate in a manufacturing step for describing the manufacturing method of the mother substrate having a plurality of external terminals (a die island and electrode terminals) according to First Embodiment of the invention.

As shown in FIG. 18, by removing the resist films 20 and 22 and removing also an extra portion of the mother substrate 19, the mother substrate 19 having the die island 3a and the electrode terminals 3b is substantially completed.

The die island 3a has an upper surface not flat but having a concave (recess) 8 at the center portion of the die island. The depth from the edge of the concave 8 to the bottom of the concave 8 is, for example, from 3 µm to 10 µm. Moreover, the vertical (first direction) and horizontal (second direction) sizes of the die island 3a when viewed from the top are smaller than the vertical (first direction) and horizontal (second direction) sizes of the semiconductor chip 3 when viewed from the top.

[P4-2: Die Bonding Step]

Next, as shown in FIG. 19, after the surface of the semiconductor chip 2 is adsorbed and supported by a cylindrical collet 29, the semiconductor chip 2 is released from the dicing tape and picked up. The semiconductor chip 2 thus picked up is transported to the die island 3a on the upper surface of the mother substrate 19.

Next, a conductive resin paste 6 is added dropwise onto the upper surface of the die island 3a. The conductive resin paste 6 is, for example, a silver (Ag) paste and it has a viscosity of, for example, from 10 Pa·s to 20 Pa·s (5 rpm). Then, the upper surface of the die island 3a and the back surface of the semiconductor chip 2 are faced each other and the semiconductor chip 2 is placed on the upper surface of the die island 3a via the conductive resin paste 6. A load is applied to the semiconductor chip 2 to fix the semiconductor chip 2.

Here, the semiconductor chip 2 is placed on the upper surface of the die island 3a via the conductive resin paste 6 with many grinding grooves 16 on the back surface of the semiconductor chip 2 so that the wettability with the conductive resin paste 6 is improved due to capillary action compared with that when the semiconductor chip 2 has no grinding groove 16 on the back surface thereof. As a result, the conductive resin paste 6 tends to be delivered to the periphery of the semiconductor chip 2, particularly, to the corner portions thereof, leading to resolution of the lack of wettability with the conductive resin paste 6.

The conductive resin paste 6 runs along many grinding grooves 16 on the back surface of the semiconductor chip 2 and turns around the side surface of the semiconductor chip 2. The conductive resin paste 6 then spreads over the side surface of the semiconductor chip 2 due to surface tension. As a result, dipping of the conductive resin paste 6 along the side surface of the die island 3a can be prevented.

In addition, the die island 3a has an upper surface not flat but having a concave 8 which will be a reservoir region of the conductive resin paste 6. Due to the collecting force of this concave 8, the conductive resin paste 6 added dropwise to the upper surface of the die island 3a gathers in the concave 8 and a portion of the paste overflowing from this concave 8 is uniformly spilt outside the concave 8. Therefore, even if a supply amount of the conductive resin paste 6 added dropwise to the upper surface of the die island 3a varies, the conductive resin paste 6 spreads uniformly and a spreading range is stable. In addition to the improvement in the wettability with the conductive resin paste 6 brought by many grinding grooves 16 on the back surface of the semiconductor chip 2, absence of sites along which a large amount of the conductive resin paste 6 flows further prevents the dripping of the conductive resin paste 6 to the side surface of the die island 3a.

It is possible to increase the viscosity of the conductive resin paste 6 to suppress spreading of it and thereby prevent the dripping of the conductive resin paste 6 to the side surface of the die island 3a. An increase in the viscosity however disturbs spreading of the conductive resin paste 6, which may prevent the uniform formation of the conductive resin paste 6 on the back surface of the semiconductor chip 2 and cause adhesion failures between the semiconductor chip 2 and the die island 3a.

<Conductive Resin Paste Baking Step P5>Next, as shown in FIG. 20, heat treatment is given to the mother substrate 19 having the plurality of semiconductor chips 2 attached thereto. This heat treatment accelerates the curing reaction of the conductive resin paste 6 to enhance the adhesion between the semiconductor chip 2 and the die island 3a.

<Wire Bonding Step P6>Next, as shown in FIG. 21, the plurality of bonding pads 4 placed at the edges of the surface of the semiconductor chip 2 and the plurality of electrode terminals 3b formed at the periphery of the die islands 3a on the upper surface of the mother substrate 19 are electrically coupled through a plurality of conductive members 5, respectively, for example, by nail head bonding (ball bonding), a method using ultrasonic vibration and thermocompression bonding in combination. As the conductive member 5, for example, a wire (gold (Au) wire) is used. More specifically, the end of the wire is melted into a ball by arc discharge under surface tension. By using a capillary (a cylindrical coupling jig), the ball is bonded to the upper surface of the bonding pad 4 and the upper surface of the electrode terminal 3b by thermocompression bonding while applying ultrasonic vibration of, for example, 120 kHz.

A forward bonding process (a process of coupling the bonding pad 4 of the semiconductor chip 2 and a portion of the wire, followed by coupling the electrode terminal 3b and the other portion of the wire) is mainly used, but a reverse bonding process (a process of coupling the electrode terminal 3b and a portion of the wire, followed by coupling the bonding pad 4 of the semiconductor chip 2 and the other portion of the wire) may be used instead.

<Molding Step P7>Next, as shown in FIG. 22, one resin molding (molded body) 7 is formed by setting the mother substrate 19 having thereon the plurality of semiconductor chips 2 in a metal molding machine, pouring a sealing resin which has been liquefied by heating into the metal molding machine while applying a pressure, and encapsulating the upper surface side of the mother substrate 19 with a sealing resin. Then, heat treatment (post cure baking) is conducted, for example, at 175° C. for 5 hours, by which portions (upper surface and side surface) of the plurality of semiconductor chips 2, a portion (side surface) of the plurality of die islands 3a, portions (upper surface and side surface) of the plurality of electrode terminals 3b, and the plurality of conductive members 5 are enclosed in the resin molding 7 which covers the upper surface side of the mother substrate 19. The resin molding 7 has a thickness of, for example, 400 um. The resin molding 7 is made of an epoxy-based thermosetting insulating resin containing, for example, a phenolic curing agent, a silicone rubber, and many fillers (for example, silica).

<Mother Substrate Peeling Step P8>Next, as shown in FIG. 23, the mother substrate 19 is peeled from the resin molding 7 while folding it. As a result, the other portions (lower surface, back surface, mounting surface) of the plurality of die islands 3a and the plurality of electrode terminals 3b are exposed from the lower surface (back surface) of the resin molding 7.

<Laser Marking Step P9>Next, as shown in FIG. 24, the upper surface of the resin molding 7 is marked with a product name and the like by using laser 30.

<Package Dicing Step P10>Next, as shown in FIG. 25, a dicing sheet 31 is provided. The dicing sheet 31 has, on the upper surface thereof, an adhesive layer 32. The adhesive layer 32 is, for example, an acrylic UV-curing type pressure-sensitive adhesive. Next, the resin molding 7 covering therewith portions (upper surface and side surface) of the plurality of semiconductor chips 2, a portion (side surface) of the plurality of die islands 3a, portions (upper surface and side surface) of the plurality of electrode terminals 3b, and the plurality of conductive members 5 is fixed to the upper surface of the dicing sheet 31 with the adhesive layer 32.

Next, with an ultrathin disk-shaped cutter (dicing blade) attached with, for example, diamond abrasive grains, the resin molding 7 is diced vertically (first direction) and horizontally (second direction) from the lower surface side of the resin molding 7 along a scribe region. At the same time, the adhesive layer 32 is also diced vertically (first direction) and horizontally (second direction) along the scribe region. The resin molding 7 is diced into individual semiconductor devices (semiconductor packages) 1, but even after individualization, the semiconductor devices 1 are kept aligned because they are fixed by the dicing sheet 31.

<Package Cleaning Step P11>Next, the semiconductor device 1 is cleaned to remove dusts generated during the dicing of the resin molding 7 and the adhesive layer 32.

<UV Exposure Step P12>Next, the dicing sheet 31 is exposed to ultraviolet rays from the lower surface side of the sheet to reduce the adhesion of the adhesive layer 32. This facilitates peeling of each of the semiconductor devices 1 from the dicing sheet 31. This dicing sheet 31 is made of an UV-permeable material so that it permits permeation of ultraviolet rays.

<Dicing Sheet Removing Step P13>Next, as shown in FIG. 26, the dicing sheet 31 is removed to obtain individual semiconductor devices 1. From the lower surface of the resin molding 7 of the semiconductor device 1, lower surfaces (back surfaces, mounting surfaces) of each of the die island 3a and the plurality of electrode terminals 3b are exposed.

<Selecting Step P14 and Visual Inspection Step P15>Next, from the semiconductor devices thus obtained, those conforming to the product standards are selected and after final visual inspection, finished products (semiconductor devices 1) are obtained.

<Packaging Step P16>Next, the products (semiconductor devices 1) are housed in recesses formed in advance in a carrier tape. Then, the carrier tape is, for example, wound around a reel. The reel is put in a moistureproof bag and the semiconductor devices are shipped in this state.

Thus, according to the present embodiment, the semiconductor chip 2 is placed on the upper surface of the die island 3a via the conductive resin paste 6 with many grinding grooves 16 left on the back surface of the semiconductor chip 2 so that the wettability with the conductive resin paste 6 is improved, leading to resolution of the lack of wettability.

In addition, the conductive resin paste 6 runs along many grinding grooves 16 on the back surface of the semiconductor chip 2 and the conductive resin paste 6 turns around the side surface of the semiconductor chip 2. The conductive resin paste 6 then spreads over the side surface of the semiconductor chip 2 due to surface tension.

Moreover, the concave 8 serving as a reservoir region of the conductive resin paste 6 is provided at the center portion of the upper surface of the die island 3a so that the conductive resin paste 6 spreads uniformly and a spreading range of it becomes stable.

The lack of wettability with the conductive resin paste 6 can therefore be overcome and at the same time, dripping of the conductive resin paste 6 along the side surface of the die island 3a can be prevented.

Such measures prevent easy release of the semiconductor chip 2 from the die island 3a and protrusion of the conductive resin paste 6 from the lower surface of the resin molding 7 after running along the side surface of the die island 3a, making it possible to suppress deterioration of the reliability of the semiconductor device 1.

(Modification Example) In the above-mentioned embodiment, the invention is applied to the semiconductor device 1 having 5 pins of external terminals (1 pin of the die island 3a and 4 pins of the electrode terminals 3b), but the invention can be applied not only to it.

Figure 28:
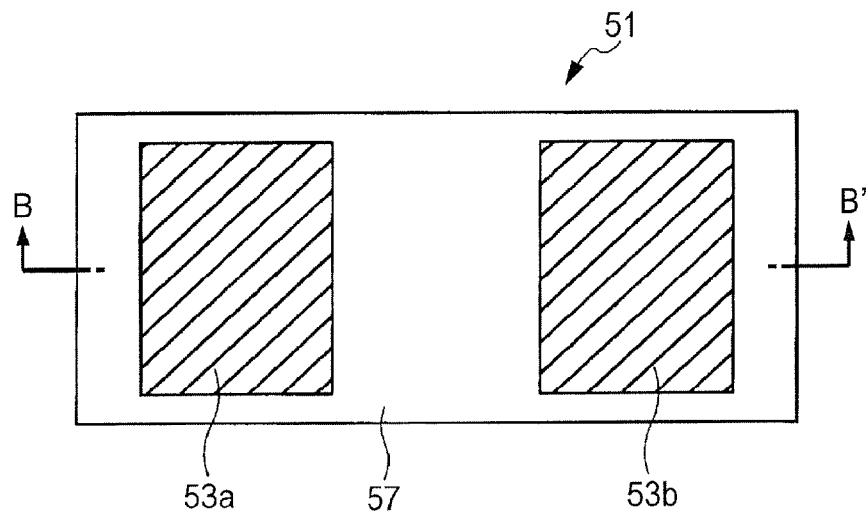
FIG. 28 is a fragmentary plan view of a semiconductor device on the back surface side (mounting surface side) having 2 pins of external terminal according to First Embodiment of the invention.

An application example of the invention to a semiconductor device having 2 pins of external terminals will next be described referring to FIGS. 28 and 29. FIG. 28 is a fragmentary plan view showing the back surface (mounting surface) side of a semiconductor device having 2 pins of external terminals (1 pin of a die island and 1 pin of an electrode terminal); and FIG. 29 is a fragmentary cross-sectional view of the semiconductor device taken along the line B-B' of FIG. 28.

Figure 29:
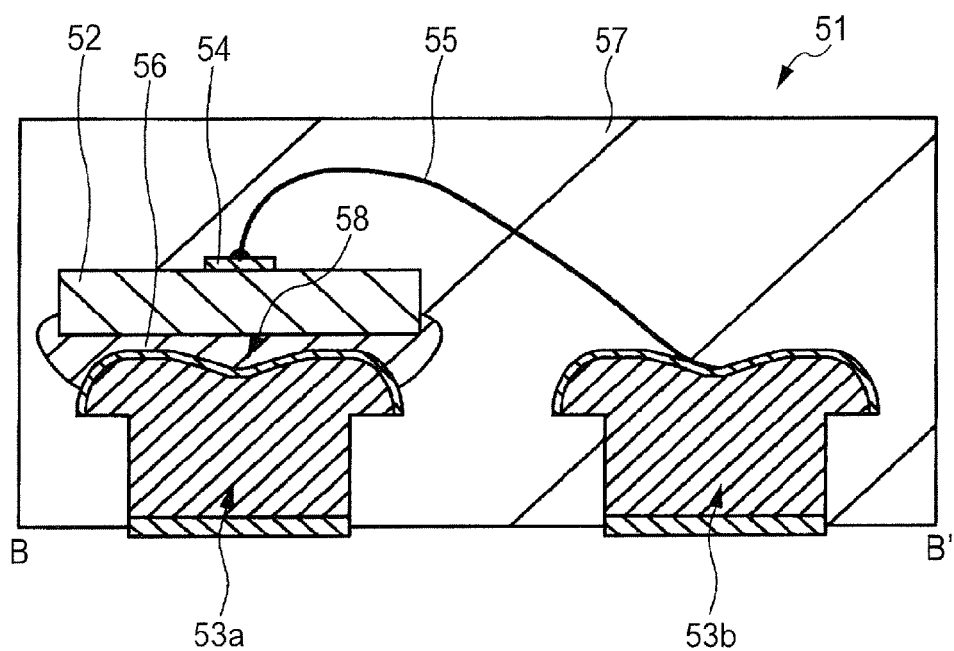
FIG. 29 is a fragmentary cross-sectional view of the semiconductor device taken along the line B-B' of FIG. 28.

As shown in FIGS. 28 and 29, a semiconductor device (semiconductor package) 51 having 2 pins of external terminals is comprised of a semiconductor chip 52, a die island (first electrode plate) 53a having thereon the semiconductor chip 52 and serving as an external terminal, and an electrode terminal (second electrode plate, electrode) 53b placed apart from the die island 53a and serving as an external terminal. The back surface of the semiconductor chip 52 and the upper surface (surface) of the die island 53a face each other and the semiconductor chip 52 is placed on the upper surface of the die island 53a via a conductive resin paste 56. In addition, a bonding pad (electrode pad, surface electrode) 54 placed on the surface of the semiconductor chip 52 and the electrode terminal 53b are electrically coupled to each other through a conductive member 55.

Moreover, portions (upper surface and side surface) of the semiconductor chip 52, a portion (side surface) of the die island 53a, portions (upper surface and side surface) of the electrode terminal 53b, and the conductive member 55 are sealed with a resin molding (molded body) 57. From the lower surface (back surface) of the resin molding 57, however, the other portions (lower surface (back surface, mounting surface)) of the die island 53a and the electrode terminal 53b are exposed.

Similar to the semiconductor device (semiconductor package) 1 having 5 pins of external terminals according to the above-mentioned embodiment, the die island 53a has an upper surface not flat but equipped with a concave (recess) 58 at the center portion thereof. The concave 58 is a region (reservoir region) where the conductive resin paste 56 gathers. In addition, the semiconductor chip 52 is placed on the upper surface of the die island 53a with many grinding grooves being left unremoved on the back surface of the semiconductor chip 52. Such a structure makes it possible to prevent lack of wettability with the conductive resin paste 56 and dripping of the conductive resin paste 56 along the side surface of the die island 53a.

The invention made by the present inventors has been described above in detail based on embodiments. It should however be borne in mind that the invention is not limited to or by them but can be modified without departing from the scope of the invention.

The invention can be applied to a semiconductor device in which a semiconductor chip is placed on the upper surface of an external terminal (die island) formed by electroplating via a conductive resin paste while facing the back surface of the semiconductor chip and the upper surface of the external terminal each other.

What is claimed is:

1. A semiconductor device comprising:
   a resin sealing portion which has a plurality of first side surfaces and a mounting surface formed between the plurality of first side surfaces;
   a die pad having an upper surface sealed by the resin sealing portion and a back surface exposed to the mounting surface;
   a plurality of electrode terminals which are formed of conductor, each electrode terminal having a first surface sealed by the resin sealing portion, a second surface exposed to the mounting surface;
   a semiconductor chip which has a first main surface and a second main surface opposite to the first main surface, is sealed by the resin sealing portion, includes a plurality of bonding pads on the first main surface and disposed on the upper surface of the die pad; and
   a plurality of wires which are sealed by the resin sealing portion, the wires electrically connecting the plurality of electrode terminals with the plurality of bonding pads of the semiconductor chip, respectively, wherein a width of the upper surface of the die pad is wider than a width of the back surface of the die pad along the first main surface of the semiconductor chip in a cross section view, and wherein a width of the second main surface of the semiconductor chip is wider than the width of the upper surface of the die pad along the first main surface of the semiconductor chip in the cross section view, wherein the semiconductor chip is disposed on the upper surface of the die pad via a conductive paste so that the second main surface of the semiconductor chip and the upper surface of the die pad face each other, and wherein a width of the conductive paste is wider than the upper surface of the die pad along the second main surface of the semiconductor chip in the cross section view.

2. A semiconductor device according to claim 1, wherein the semiconductor chip has a plurality of second side surfaces between the first main surface and the second main surface, and wherein the conductive paste is disposed on the second main surface and portions of the second side surfaces of the semiconductor chip.

3. A semiconductor device according to claim 1, wherein the upper surface of the die pad is completely covered with the semiconductor chip.

4. A semiconductor device according to claim 1, wherein the electrode terminals are arrayed around the die pad.

5. A semiconductor device according to claim 1, wherein the die pad has a concave on the upper surface.

6. A semiconductor device according to claim 5, wherein the concave of the die pad has a depth of from 3 um to 10 um from the edge of the concave to the depth of the concave.

7. A semiconductor device according to claim 1, wherein the die pad is formed of conductor, and wherein the conductive paste is a silver paste.

8. A semiconductor device according to claim 1, wherein the die pad and the electrode terminals have a nickel film and a silver or gold film formed over the nickel film.

* * * * *